United States Patent
Seo et al.

(10) Patent No.: US 12,014,951 B2
(45) Date of Patent: Jun. 18, 2024

(54) SEMI-DAMASCENE STRUCTURE WITH DIELECTRIC HARDMASK LAYER

(71) Applicant: SAMSUNG ELECTRONICS CO., LTD., Suwon-si (KR)

(72) Inventors: Hoonseok Seo, Niskayuna, NY (US); Euibok Lee, Seoul (KR); Taeyong Bae, Albany, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 185 days.

(21) Appl. No.: 17/390,035

(22) Filed: Jul. 30, 2021

(65) Prior Publication Data

US 2022/0375785 A1    Nov. 24, 2022

Related U.S. Application Data

(60) Provisional application No. 63/191,037, filed on May 20, 2021.

(51) Int. Cl.
*H01L 21/768* (2006.01)
*H01L 21/3213* (2006.01)
(Continued)

(52) U.S. Cl.
CPC .. *H01L 21/76816* (2013.01); *H01L 21/32139* (2013.01); *H01L 21/76832* (2013.01);
(Continued)

(58) Field of Classification Search
CPC ......... H01L 21/76816; H01L 21/32139; H01L 21/76832; H01L 21/76879;
(Continued)

(56) References Cited

U.S. PATENT DOCUMENTS 6,720,249 B1 * 4/2004 Dalton .............. H01L 21/76816
438/692
7,335,590 B2   2/2008 Suh et al.
(Continued)

*Primary Examiner* — Shahed Ahmed
*Assistant Examiner* — Vicki B. Booker
(74) *Attorney, Agent, or Firm* — Sughrue Mion, PLLC

(57) ABSTRACT

A method of manufacturing a semi-damascene structure of a semiconductor device includes: forming a $1^{st}$ intermetal dielectric layer; forming a $1^{st}$ hardmask layer and at least one $1^{st}$ photoresist pattern on the $1^{st}$ intermetal dielectric layer; patterning at least one via hole penetrating through the $1^{st}$ hardmask layer and the $1^{st}$ intermetal dielectric using the $1^{st}$ photoresist pattern; removing the $1^{st}$ photoresist pattern among the $1^{st}$ photoresist pattern and the $1^{st}$ hardmask layer; forming a metal structure in the via hole such that the metal structure fills in the vial hole and extends on the $1^{st}$ hardmask layer; patterning the metal structure to form at least one $1^{st}$ trench penetrating at least the metal structure at a portion where the metal structure extends on the $1^{st}$ hardmask layer; and filling the $1^{st}$ trench with a $2^{nd}$ inter-metal layer.

11 Claims, 20 Drawing Sheets

(51) Int. Cl.
*H01L 23/522* (2006.01)
*H01L 23/528* (2006.01)
*H01L 23/532* (2006.01)

(52) U.S. Cl.
CPC .... *H01L 21/76879* (2013.01); *H01L 23/5226* (2013.01); *H01L 23/5283* (2013.01); *H01L 23/53266* (2013.01)

(58) Field of Classification Search
CPC ......... H01L 21/76837; H01L 21/76885; H01L 21/76829; H01L 21/7681; H01L 21/0337; H01L 21/76877; H01L 23/5226; H01L 23/5283; H01L 23/53266; H01L 23/53295
See application file for complete search history.

(56) References Cited

U.S. PATENT DOCUMENTS

| | | |
|---|---|---|
| 7,767,587 B2 | 8/2010 | Fuller et al. |
| 9,129,967 B2 | 9/2015 | Tsai et al. |
| 9,490,205 B2 | 11/2016 | Tsai et al. |
| 9,716,035 B2 | 7/2017 | Yang et al. |
| 10,312,136 B2 | 6/2019 | Singh et al. |
| 10,566,231 B2 | 2/2020 | O'Toole et al. |
| 2004/0127001 A1* | 7/2004 | Colburn .............. H01L 23/5222 438/586 |
| 2011/0092069 A1* | 4/2011 | Cheng ............... H01L 21/76829 257/E21.294 |
| 2017/0025347 A1 | 1/2017 | Singh et al. |

* cited by examiner

10

10

10

10

SEMI-DAMASCENE STRUCTURE WITH DIELECTRIC HARDMASK LAYER

CROSS-REFERENCE TO THE RELATED APPLICATION

This application is based on and claims priority from U.S. Provisional Application No. 63/191,037 filed on May 20, 2021 in the U.S. Patent and Trademark Office, the disclosure of which is incorporated herein in its entirety by reference.

BACKGROUND

1. Field

Apparatuses and methods consistent with example embodiments of the inventive concept relate to a semi-damascene structure of a semiconductor device, more particularly, to a semi-damascene structure including a dielectric hardmask layer to form a semiconductor device and a method of manufacturing the same.

2. Description of the Related Art

FIGS. 1A-1F illustrate cross-sectional views showing a related-art method of forming a semi-damascene structure which is used as a back-end-of-line (BEOL) structure of a semiconductor device. The semi-damascene structure introduced by Interuniversity Microelectronics Centre (IMEC) largely includes a via structure obtained by a damascene process and a metal line structure formed above the via structure for connection thereto.

FIG. 1A shows that a $1^{st}$ intermetal dielectric layer 110-1 is formed on a semiconductor substrate 100 with an underlying etch stop layer 105 interposed therebetween to form an initial semiconductor device structure 10. In the substrate 100, at least one transistor may be formed to be connected to a semi-damascene structure to be formed above the substrate 100 as described hereafter.

Referring to FIG. 1B, a hardmask layer 115 is formed on the $1^{st}$ intermetal dielectric layer 110-1 and planarized, after which a photoresist material is formed on the hardmask layer 115 and patterned to obtain a plurality of photoresist patterns 120 and a plurality of $1^{st}$ trenches T1 through which the hardmask layer 115 and the $1^{st}$ intermetal dielectric layer 110-1 therebelow are to be etched.

Referring to FIG. 1C, the hardmask layer 115, the intermetal dielectric layer 110-1 and the etch stop layer 105 are etched down using the photoresist patterns 120 as mask structure to form at least one via hole H in the intermetal dielectric layer 110-1 exposing the substrate 100, and then, the photoresist patterns 120 and the hardmask layer 115 are removed by ashing or etching.

Referring to FIG. 1D, a metal structure 130 is formed in the via hole H and on a top surface of the $1^{st}$ intermetal dielectric layer 110-1. Here, the metal structure 130 may be formed of copper (Cu), and thus, a barrier metal layer (not shown) such as tantalum (Ta) or tantalum nitride (TaN) may need to be first layered inside the via hole H and on the $1^{st}$ intermetal dielectric layer 110-1, and then, the metal structure 130 may fill out the via hole H and extends on the top surface of the $1^{st}$ intermetal dielectric layer 110-1.

Referring to FIG. 1E, the metal structure 130 is etched to form a $2^{nd}$ trench T2 exposing the $1^{st}$ intermetal dielectric layer 110-1. Although not shown in FIG. 1E, another hardmask layer and a photoresist pattern may be formed on the metal structure 130, and plasma dry etching may be performed to etch down the metal structure 130 using the other hardmask layer and the photoresist pattern as mask structure. By this plasma dry etching, two metal lines 140A and 140B are formed at both sides of the $2^{nd}$ trench T2, respectively. These metal lines 140A and 140B may be connected to at least one active region of at least one transistor that may be included in the substrate 100 to connect the transistor with a power source or another circuit element.

Referring to FIG. 1F, a $2^{nd}$ intermetal dielectric layer 110-2 is filled in the $2^{nd}$ trench T2 to insulate the two metal lines 140A and 140B from each other, thereby completing the semi-damascene structure of the semiconductor device structure 10.

However, it is learned that the above-described method of forming a semi-damascene structure discloses the following defects. When the metal structure 130 is filled in the via hole H and extends on the $1^{st}$ intermetal dielectric layer 110 to contact the $1^{st}$ intermetal dielectric layer 110 as shown in FIG. 1D, the $1^{st}$ intermetal dielectric layer 110-1 is often damaged at its upper portion including a top surface TS, which increases the dielectric constant value (k) of the $1^{st}$ intermetal dielectric layer 110 to adversely affect performance of the $1^{st}$ intermetal dielectric layer 110. In addition, when the metal structure 130 is etched, for example, by plasma dry etching, as shown in FIG. 1E to obtain the metal lines 140A and 140B, the $1^{st}$ intermetal dielectric layer 110 is further damaged due to etch loading (over-etch) as shown FIG. 1E. It is further learned that, when etch loading occurs at an intermetal dielectric layer, a time-dependent dielectric breakdown (TDDB) voltage of the intermetal dielectric layer is weakened, which deteriorates performance of the intermetal dielectric layer 110.

In the meantime, FIG. 1G illustrates a cross-section view of the above-described semi-damascene structure taken along a line I-I' in FIG. 1E.

Referring to FIG. 1G, under-etching also often occurs when the metal structure 130 is densely etched to obtain narrow trenches T3, which leads to a short circuit between the metal line 140B and each of metal lines 150A and 150B formed by the dense etching. The under-etching is also a cause of misalignment of the metal lines 150A and 150B with other circuit elements.

Thus, there is demand of an improved semi-damascene structure and a method of forming the same.

Information disclosed in this Background section has been learned by the inventors before achieving the embodiments of the present application or is technical information acquired in the process of achieving the embodiments described herein. Therefore, it may contain information that does not form prior art that is already known to the public.

SUMMARY

The disclosure provides a semi-damascene structure of a semiconductor device, in which a dielectric hardmask layer is embedded in a intermetal dielectric layer isolating metal lines.

According to embodiments, there is provided a method of manufacturing a semi-damascene structure of a semiconductor device. The method may include: forming a $1^{st}$ intermetal dielectric layer; forming a $1^{st}$ hardmask layer and at least one $1^{st}$ photoresist pattern on the $1^{st}$ intermetal dielectric layer; patterning at least one via hole penetrating through the $1^{st}$ hardmask layer and the $1^{st}$ intermetal dielectric using the $1^{st}$ photoresist pattern; removing the $1^{st}$ photoresist pattern among the $1^{st}$ photoresist pattern and the $1^{st}$ hardmask layer; forming a metal structure in the via hole such that the metal structure fills in the vial hole and extends on the $1^{st}$ hardmask layer; patterning the metal structure to form at least one $1^{st}$ trench penetrating at least the metal structure at a portion where the metal structure extends on the $1^{st}$ hardmask layer; and filling the $1^{st}$ trench with a $2^{nd}$ inter-metal layer.

According to embodiments, there is provided a method of manufacturing a semiconductor device. The method may include: forming a substrate in which at least one transistor structure is included; and performing the above method of manufacturing a semi-damascene structure to obtain a semi-damascene structure such that a metal structure included in the semi-damascene structure is connected to an active region of the transistor structure According to embodiments, there is provided a semi-damascene structure which may include: an intermetal dielectric layer including a $1^{st}$ intermetal dielectric layer, in which at least one via hole is formed, and a $2^{nd}$ intermetal dielectric layer formed above the $1^{st}$ intermetal dielectric layer and connected to the $1^{st}$ intermetal dielectric layer; a $1^{st}$ metal line including a $1^{st}$ portion formed in the via hole and vertically extended above the via hole, and a $2^{nd}$ portion formed vertically above the $1^{st}$ intermetal dielectric layer; a $2^{nd}$ metal line isolated from the $1^{st}$ metal line through the intermetal dielectric layer, and vertically penetrating the intermetal dielectric layer; and a hardmask layer interposed between the $2^{nd}$ portion of the metal line and the $1^{st}$ intermetal dielectric layer formed therebelow, wherein an upper portion of the hardmask layer formed below the $2^{nd}$ intermetal dielectric layer is vertically dented.

According to embodiments, there is provided a semi-damascene structure which may include: an intermetal dielectric layer including a $1^{st}$ intermetal dielectric layer, in which at least one via hole is formed, and a $2^{nd}$ intermetal dielectric layer formed above the $1^{st}$ intermetal dielectric layer and connected to the $1^{st}$ intermetal dielectric layer; a $1^{st}$ metal line including a $1^{st}$ portion formed in the via hole and vertically extended above the via hole, and a $2^{nd}$ portion formed vertically above the $1^{st}$ intermetal dielectric layer; a $2^{nd}$ metal line isolated from the $1^{st}$ metal line through the intermetal dielectric layer, and vertically penetrating the intermetal dielectric layer; and a hardmask layer interposed between the $2^{nd}$ portion of the metal line and the $1^{st}$ intermetal dielectric layer formed therebelow, wherein the $1^{st}$ intermetal dielectric layer is connected to the $2^{nd}$ intermetal dielectric layer without the hardmask layer interposed therebetween at a position between the $1^{st}$ metal line and the $2^{nd}$ metal line.

According to embodiments, there is provided a semiconductor device which may include: a substrate in which at least one transistor is formed; and one of the semi-damascene structures describe above, wherein at least one of the $1^{st}$ metal line and the $2^{nd}$ metal line is connected to an active region of the transistor.

BRIEF DESCRIPTION OF THE DRAWINGS

Example embodiments of the inventive concept will be more clearly understood from the following detailed description taken in conjunction with the accompanying drawings in which:

FIGS. 2A-2L illustrate a method of manufacturing a semi-damascene structure of a semiconductor device, according to an embodiment;

DETAILED DESCRIPTION OF THE EMBODIMENTS

Figure 1A:
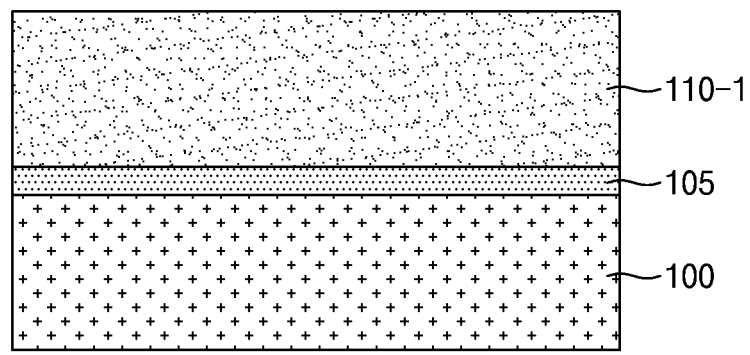
FIGS. 1A-1G illustrate cross-sectional views showing a related-art method of forming a semi-damascene structure which is used as a back-end-of-line (BEOL) structure of a semiconductor device.
Figure 1B:
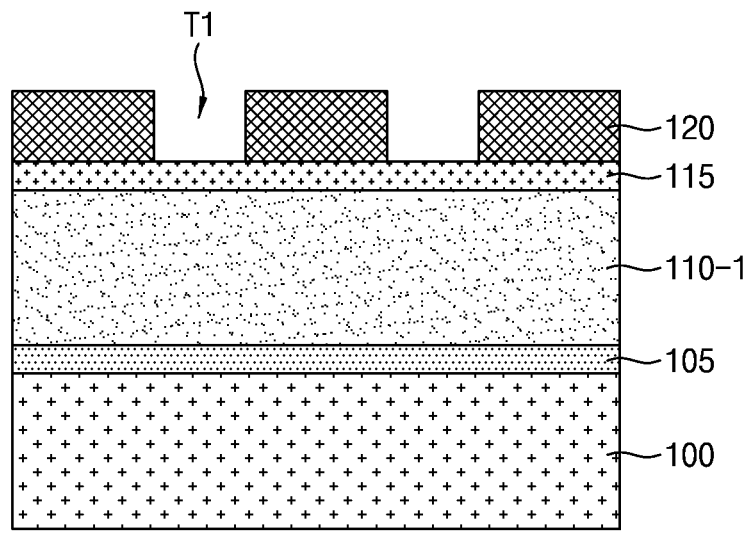
Figure 1C:
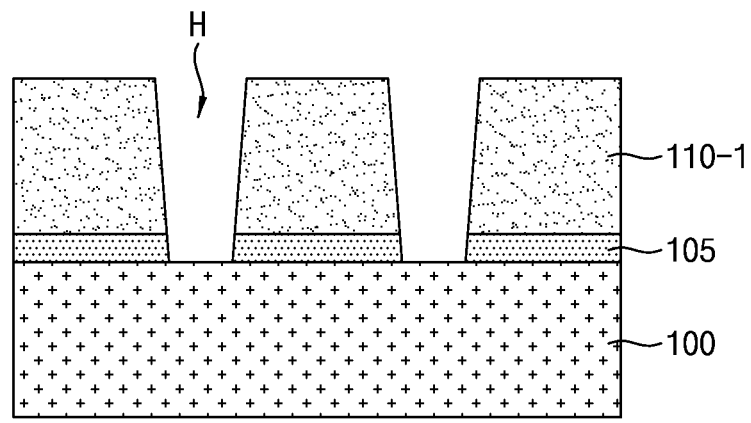

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

It will be also understood that, even if a certain step or operation of manufacturing an inventive apparatus or structure is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements of semiconductor devices may or may not be described in detail herein.

FIGS. 2A-2I illustrate a method of manufacturing a semi-damascene structure of a semiconductor device, according to embodiments.

Figure 2A:
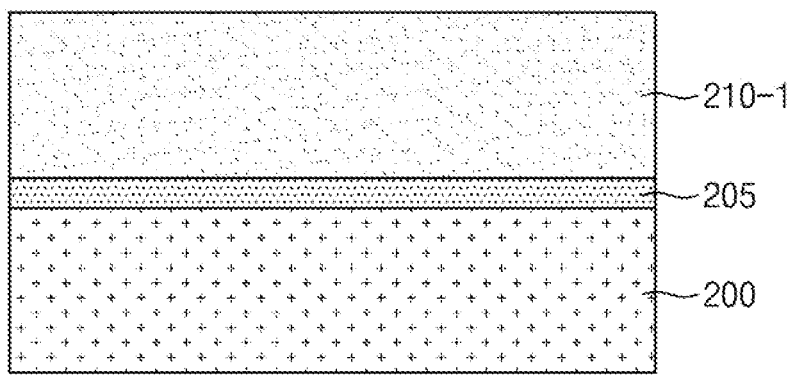

FIG. 2A shows that an initial structure of a semiconductor device 20 includes a $1^{st}$ intermetal dielectric layer 210-1 formed on a semiconductor substrate 200 with an underlying etch stop layer 205 interposed therebetween. In the substrate 200, at least one transistor may be formed for connection with a semi-damascene structure to be formed on the substrate 200 as described hereafter. However, the semi-damascene structure to be described hereafter may be formed on another semi-damascene structure instead of the substrate 200 including at least one transistor, according to an embodiment.

The substrate 200 may be formed of one or more silicon (Si) or Si-compound layers, and may further include at least one passive element such as capacitor in addition to the transistor. The intermetal dielectric layer 210-1 may be formed of one or more low-k dielectric materials having a dielectric constant value (k) of 2.7 to 3.0. The intermetal dielectric layer 210-1 may be a carbon-doped oxide dielectric material including Si, carbon, oxide and hydrogen (SiCOH). The etch stop layer 205 may be formed of one or more dielectric materials having a dielectric constant value (k) of about 5.0 such as aluminum oxide ($AlO_x$), aluminum nitride (AlN), aluminum oxide nitride (AlON), and silicon carbon nitride (SiCN), not being limited thereto. The etch stop layer 205 may be formed on the substrate 200 by at least one of physical vapor deposition (PVD), chemical vapor deposition (CVD) and atomic layer deposition (ALD), not being limited thereto. The intermetal dielectric layer 210-1 may be formed by at least one of plasma-enhanced chemical vapor deposition (PECVD) and flowable CVD, not being limited thereto.

Figure 2B:
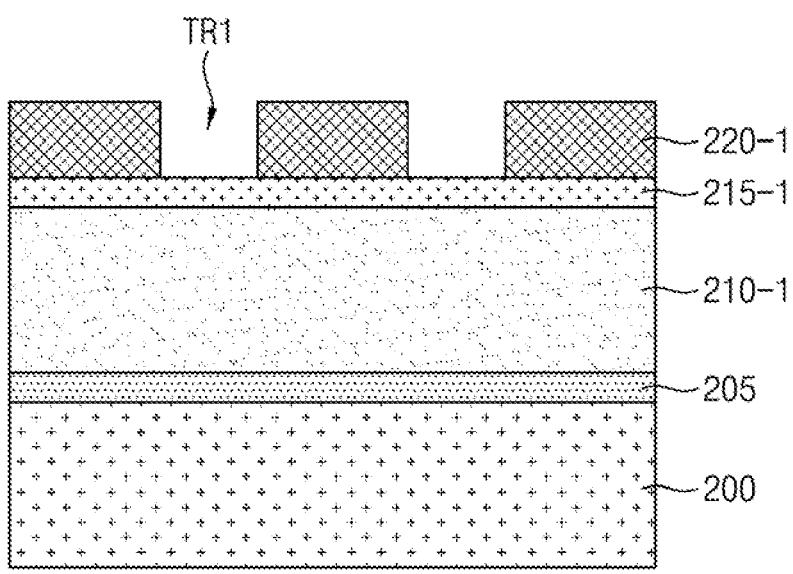

Referring to FIG. 2B, a $1^{st}$ hardmask layer 215-1 is formed on the $1^{st}$ intermetal dielectric layer 210-1 and planarized, after which a $1^{st}$ photoresist material is formed on the $1^{st}$ hardmask layer 215-1 and patterned to obtain a plurality of $1^{st}$ photoresist patterns 220-1 and a plurality of $1^{st}$ trenches TR1 through which the $1^{st}$ hardmask layer 215-1 and the $1^{st}$ intermetal dielectric layer 210-1 therebelow are to be etched.

The formation of the $1^{st}$ hardmask layer 215-1 and the $1^{st}$ photoresist patterns 220-1 may be performed by at least one of PVD, CVD, PECVD and ALD, not being limited thereto. The planarization of the $1^{st}$ hardmask layer 215-1 may be performed by chemical-mechanical polishing (CMP), not being limited thereto, and the $1^{st}$ photoresist patterns 220-1 may be obtained through applying a photolithography process. Although FIG. 2B shows only three $1^{st}$ photoresist patterns 220-1 and two $1^{st}$ trenches TR1, the numbers of these patterns and trenches are not limited thereto. The $1^{st}$ hardmask layer 215-1 may include a plurality of vertically stacked layers formed of at least one of $AlO_x$, AN, AlON, silicon dioxide ($SiO_2$), silicon oxynitride (SiON) and SiCN, not being limited thereto, and the $1^{st}$ photoresist material forming the $1^{st}$ photoresist patterns 220-1 may include an organic polymer resin containing a photoactive (light sensitive) material.

Figure 2C:
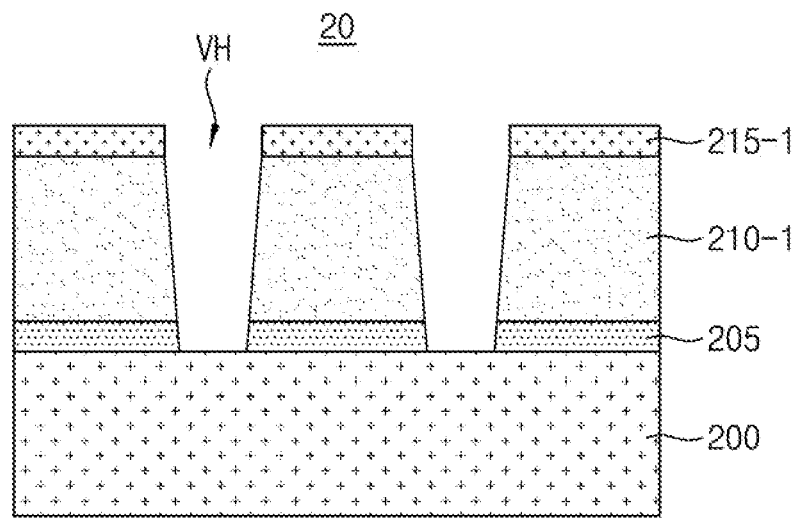

Referring to FIG. 2C, the $1^{st}$ intermetal dielectric layer 210-1 and the etch stop layer 205 are etched down using the $1^{st}$ photoresist patterns 220-1 and the $1^{st}$ hardmask layer 215-1 as mask structures to form at least one via hole VH corresponding to the $1^{st}$ trench TR1 and exposing the substrate 200, and then, the $1^{st}$ photoresist patterns 220-1 are removed by stripping, ashing and/or etching operations. In this etching operation, the $1^{st}$ hardmask layer 215-1 may be first etched, for example, by dry etching, and then, the $1^{st}$ intermetal dielectric layer 210-1 and the etch stop layer 205 are dry-etched using the $1^{st}$ photoresist pattern 220-1 and the $1^{st}$ hardmask layer 215-1 as mask structure. In addition, if there remains any residues of the etch stop layer 205 after the foregoing dry etching operation, the residue may be wet-etched out to expose the substrate 200, and the $1^{st}$ photoresist patterns 220-1 may be removed.

Here, it is noted that, when the $1^{st}$ intermetal dielectric layer 210-1 and the etch stop layer 205 are etched, and the 1st photoresist patterns 220-1 are removed, the 1st hardmask layer 215-1 is not removed along with the 1st photoresist patterns 220-1, and instead, remains on the 1st intermetal dielectric layer 210-1, according to an embodiment. That is, only the 1st photoresist patterns 220-1 of the mask structures used for etching the 1st intermetal dielectric layer 210-1 may be selectively removed. Since the 1st hardmask layer 215-1 may be formed of a plurality of vertically stacked layers, one or more of the layers of the 1st hardmask layer 215-1 may also be removed along with the 1st photoresist patterns 220-1 when the 1st photoresist patterns 220-1 are removed after the above etching operation on the 1st intermetal dielectric layer 210-1 and the etch stop layer 205. However, for manufacturing convenience, all of the layers of the 1st hardmask layer 215-1 may remain on the 1st intermetal dielectric layer 210-1 without being removed along with the photoresist pattern 220-1, according to an embodiment.

Figure 2D:
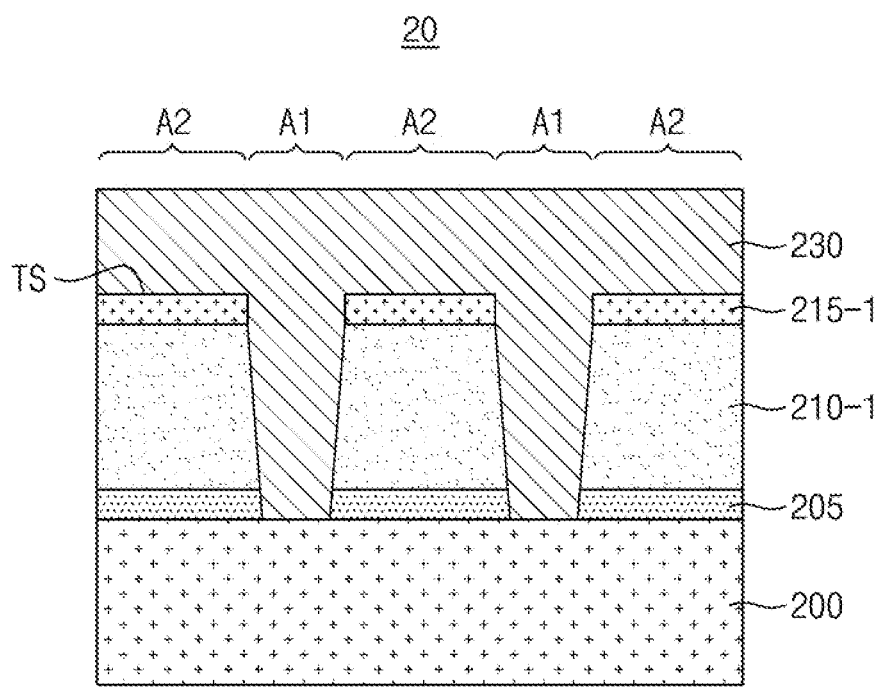

The reason for having the 1st hardmask layer 215-1 remain on the 1st intermetal dielectric layer 210-1 is to address the defects of the related-art method of manufacturing a semi-damascene structure discussed above in the Background section. By having the 1st hardmask layer 215-1 on the 1st intermetal dielectric layer 210-1, it is possible to avoid a damage to the 1st intermetal dielectric layer 210-1 when a metal structure 230 is filled in the via hole VH and extends on the 1st intermetal dielectric layer 210-1 in a subsequent operation (FIG. 2D). It is learned that such damage to the 1st intermetal dielectric layer 210-1 increase the dielectric constant value (k) of the 1st intermetal dielectric layer 210-1, thereby deteriorating the performance of the 1st intermetal dielectric layer 210-1. Further, by having the 1st hardmask layer 215-1 remain on the 1st intermetal dielectric layer 210-1, the present embodiment is able to prevent etch loading due to over-etching or under-etching of the metal structure 230 in a later operation (FIG. 2G), as discussed above in the Background section.

Figure 1D:
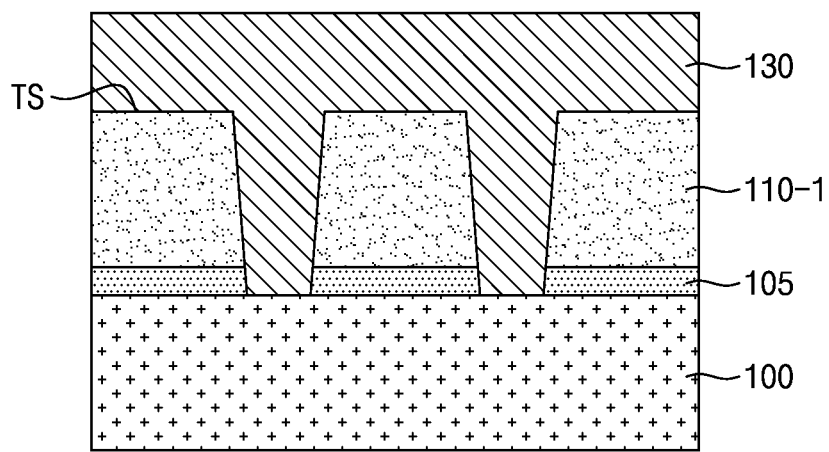
Figure 1E:
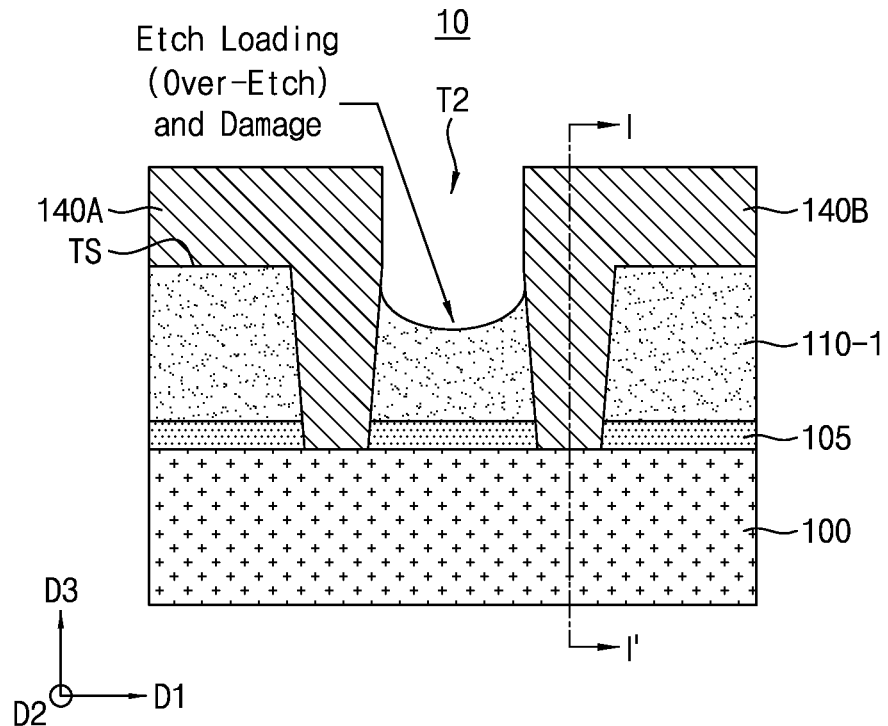
Figure 1F:
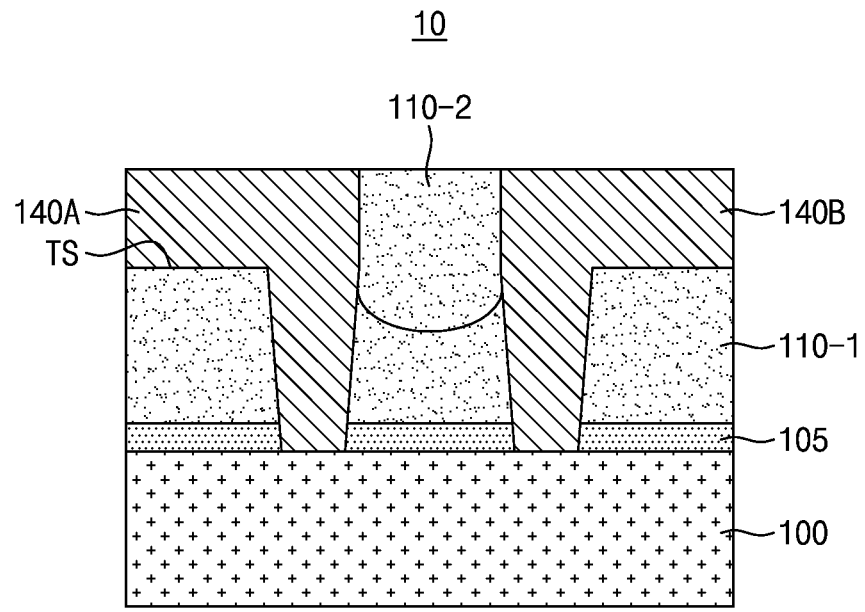
Figure 1G:
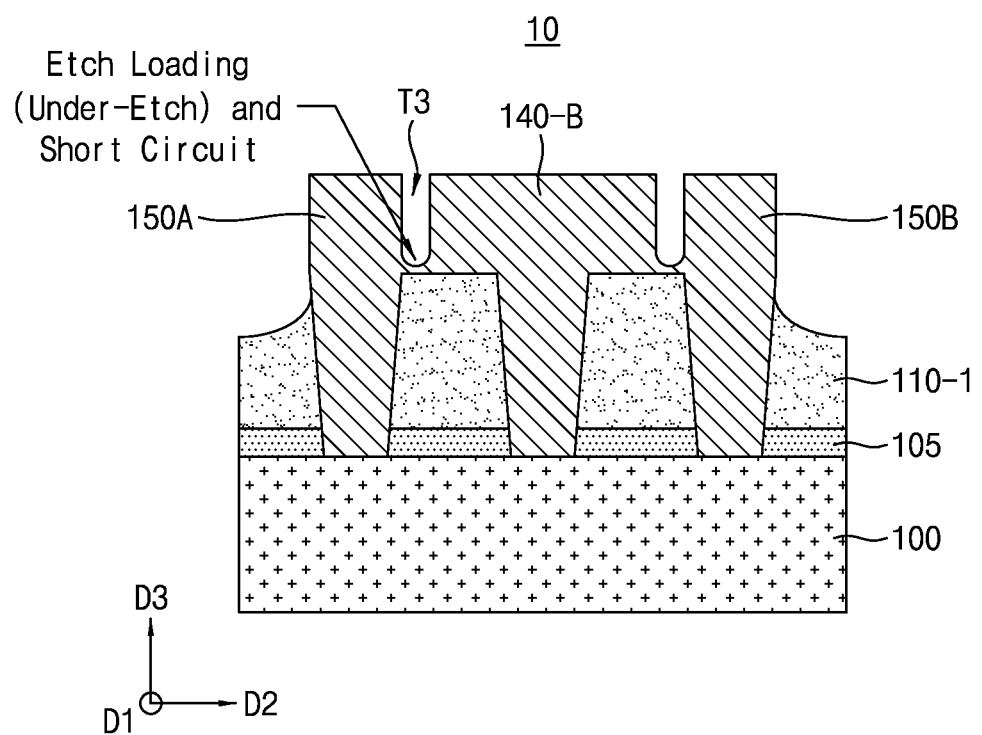

Referring to FIG. 2D, the metal structure 230 is formed in the via hole VH and on the 1st intermetal dielectric layer 210-1. In this operation, the metal structure 230 fills out the via hole VH and extends on a top surface TS of the intermetal dielectric layer 210-1, and thus the metal structure 230 includes at least one portion A1 formed in the via hole VH and vertically extended above the via hole VH, and at least one portion A2 extended on the 1st hardmask layer 215-1 above the 1st intermetal dielectric layer 210-1. According to an embodiment, the metal structure 130 is formed of a material such as ruthenium (Ru), molybdenum (Mo), cobalt (Co), tungsten (W), or their combination, not being limited thereto, that enables superior direct etching thereon in a subsequent operation (FIG. 2G). It is learned that a metal such as copper (Cu) having a large grain size is not appropriate for direct etching to be performed in a subsequent operation in terms of nano-scale precision patterning of metal lines of a semiconductor device structure. Further, when the metal structure 230 formed on the foregoing material examples, no barrier metal layer needs to be formed inside the via hole VH and on the 1st intermetal dielectric layer 210-1 before the metal structure 230 is formed inside the via hole VH and on the top surface of the intermetal dielectric layer 210-1. Moreover, as the metal structure 230 is formed on the 1st hardmask layer 215-1 instead of the 1st intermetal dielectric layer 210-1, a damage that occurs on a top surface TS of the 1st intermetal dielectric layer 210-1 in the relate-art method described in reference to FIG. 1D is avoided.

Figure 2E:
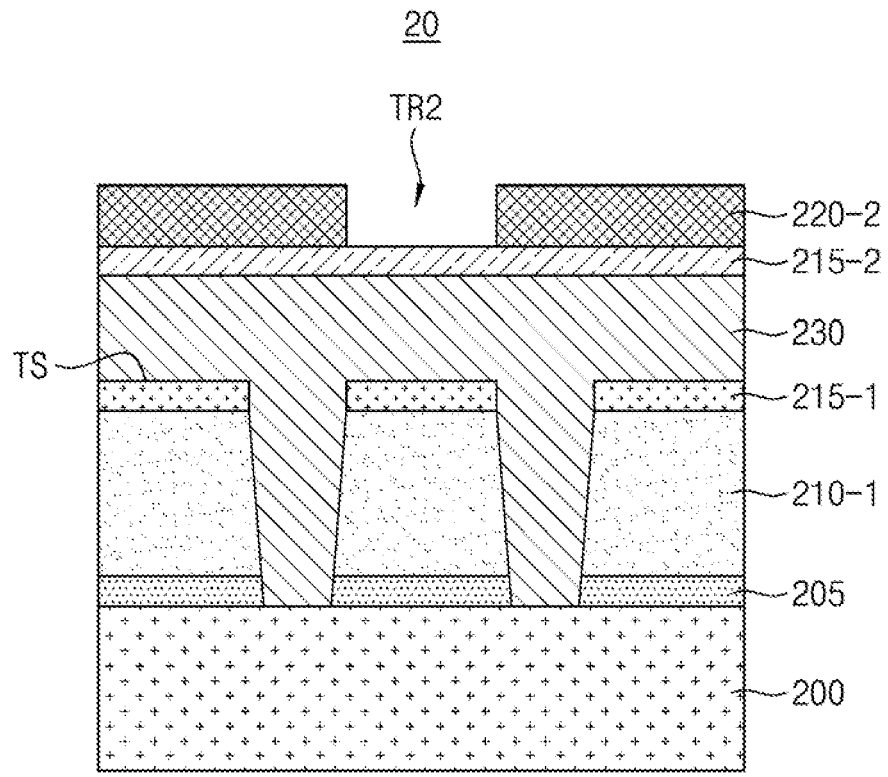

Referring to FIG. 2E, a 2nd hardmask layer 215-2 is formed on the metal structure 230 and planarized, and a 2nd photoresist material is formed on the 2nd hardmask layer, developed and patterned to obtain a plurality of 2nd photoresist patterns 220-2 and a 2nd trench TR2 through which the 2nd hardmask layer 215-2 and the metal structure 230 therebelow are to be etched.

The formation of the 2nd hardmask layer 215-2 and the 2nd photoresist patterns 220-2 may also be the same as that of the 1st hardmask layer 215-1 and the 1st photoresist patterns 220-1 as described above in reference to FIG. 2B. Further, the 2nd photoresist material forming the 2nd photoresist patterns 220-2 may be the same as the 1st photoresist material forming the 1st photoresist patterns 220-1, and the 2nd hardmask layer 215-2 may be formed of one or more materials forming the 1st hardmask layer 215-1. Thus, duplicate descriptions are omitted herein. However, it is noted that the 2nd hardmask layer 215-2 may have material composition with an etch rate or etch selectivity which is substantially the same as or different from an etch rate or etch selectivity of material composition of the 1st hardmask layer 215-1, as will be described later, according to embodiments.

Figure 2F:
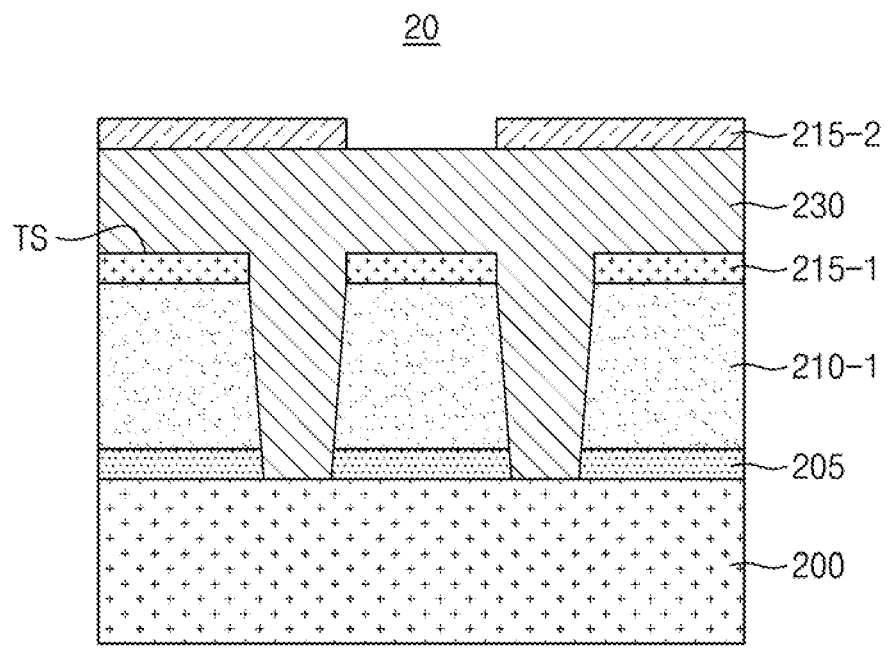
Figure 2G:
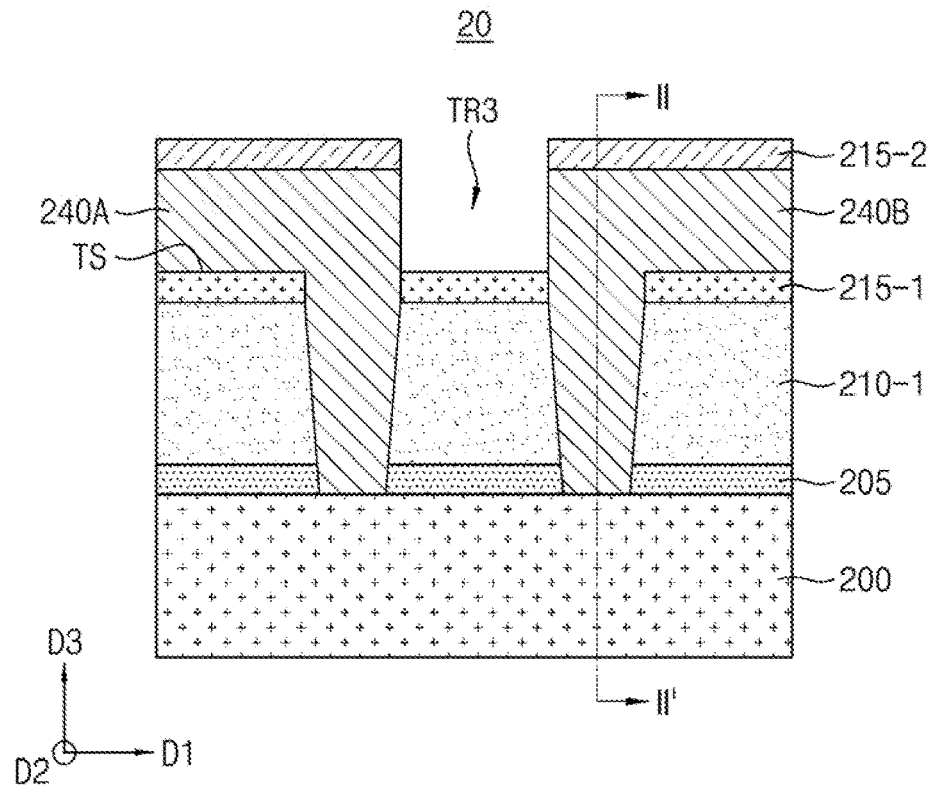

Referring to FIG. 2F, the shapes and patterns of the 2nd photoresist patterns 220-2 are transferred to the 2nd hardmask layer 215-2 by, for example, dry etching, and the 2nd photoresist patterns 220-2 are removed by stripping, ashing and/or etching that leaves the patterned 2nd hardmask layer 215-2 on the metal structure 230.

Referring to FIG. 2G, the metal structure 230 is etched down to the 1st hardmask layer 215-1 according to the patterns of the 2nd hardmask layer 215-2. Here, the etching operation may be performed, for example, by direct etching, which may be plasma dry etching, not being limited thereto. As a result of the direct etching, a 3rd trench TR3 is obtained to expose the 1st hardmask layer 215-1 at the bottom of the 3rd trench TR3, and two metal lines 240A and 240B are formed at both sides of the 3rd trench TR3.

Here, it is noted that, due to the 1st hardmask layer 215-1 functioning as etch stop layer, no etch loading occurs at the 1st intermetal dielectric layer 210-1 formed below the 1st hardmask layer 215-1, thereby addressing the etch loading defect of the related-art method of manufacturing a semi-damascene structure. It is further noted that, since the etching operation performed on the metal structure 230 is direct etching, no additional layer such as a barrier metal layer may be necessary on side surfaces of the metal lines 240A and 240B facing the 3rd trench TR3 for a later operation.

Figure 2H:
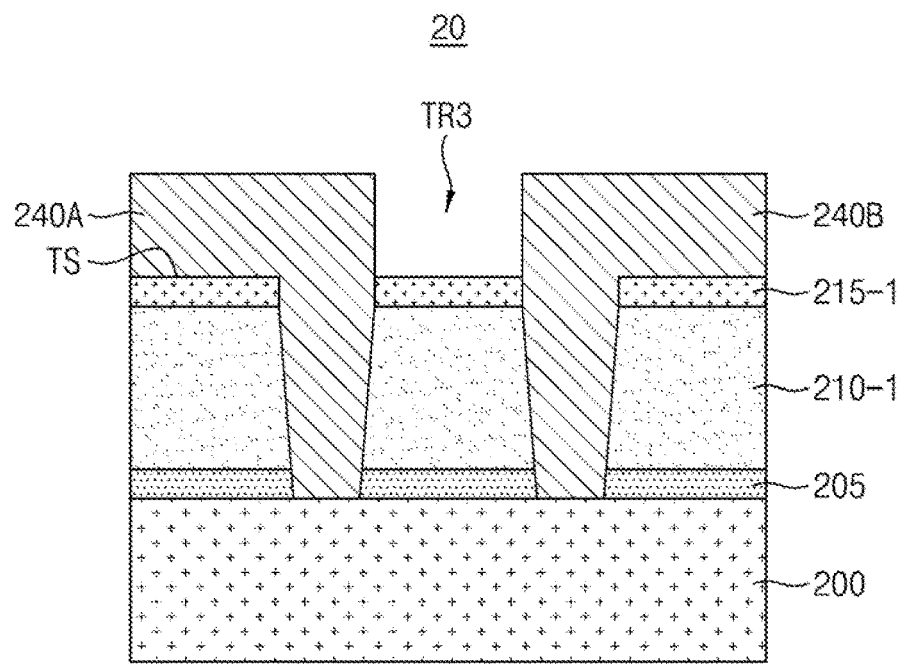
Figure 21:
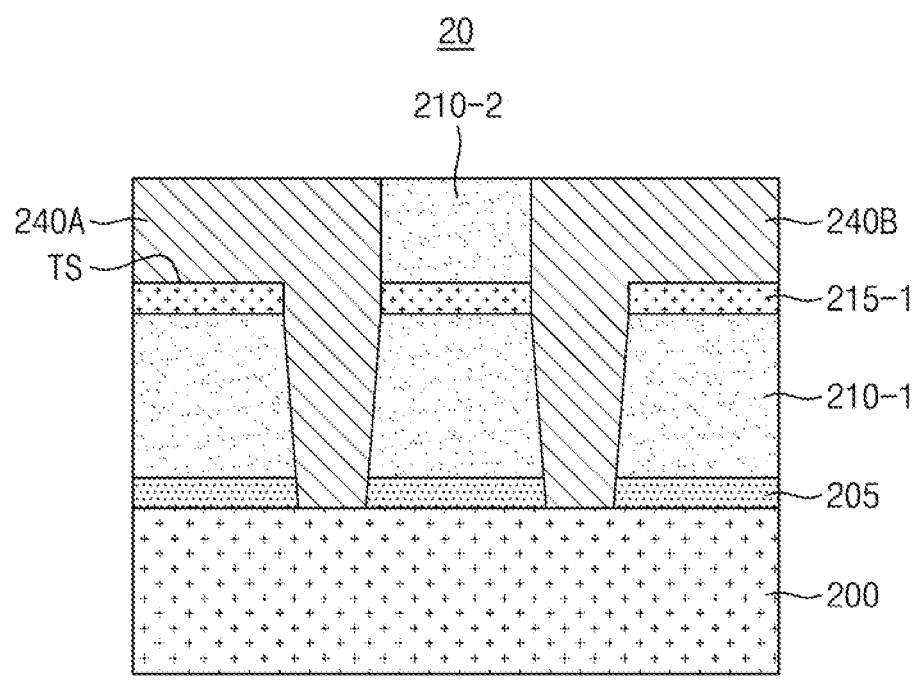

Referring to FIG. 2H, the patterned 2nd hardmask layer 215-2 is removed, for example, by wet etching, so that the two metal lines 240A and 240B can be provided for direct or indirect connection to at least one active region of at least one transistor that may be included in the substrate 200 to connect the transistor with a power source or another circuit element. It is noted here that the 2nd hardmask layer 215-2 may have material composition different from the 1st hardmask layer 215-1 in terms of etch rate or etch selectivity according to an embodiment. For example, when the 1st hardmask layer 215-1 is formed of one of $AlO_x$, AlN, AlON, $SiO_2$, SiON and SiCN, the 2nd hardmask layer 215-2 may be formed of another of $AlO_x$, AlN, AlON, $SiO_2$, SiON and SiCN. Thus, the wet etching operation applied to the semiconductor device structure 20 may remove only the 2nd hardmask layer 215-2 leaving the 1st hardmask layer 215-2 on the 1st intermetal dielectric layer 210-1 as shown in FIG. 2H.

Referring to FIG. 2I, the 3rd trench TR3 is filled with a 2nd intermetal dielectric layer 210-2 isolating the two metal lines 240A and 240B from each other to complete the semi-damascene structure of the semiconductor device structure 20. The 2$^{nd}$ intermetal dielectric layer may be formed of the same material forming the 1$^{st}$ intermetal dielectric layer 210-1, and thus, duplicate descriptions are omitted herein.

Figure 2J:
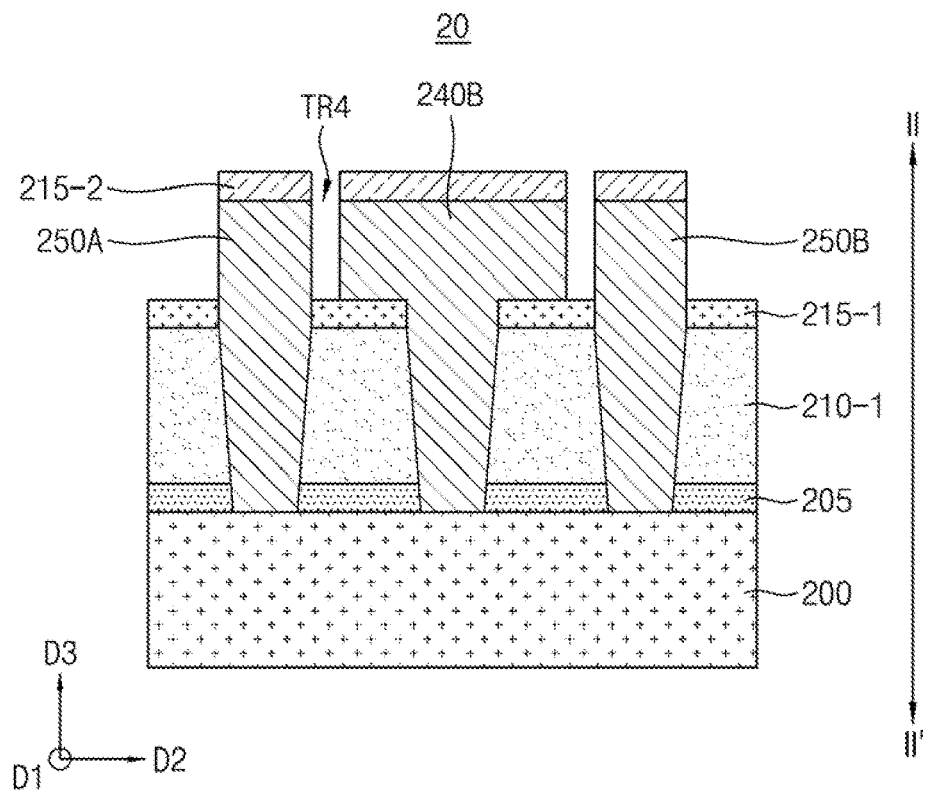
Figure 2K:
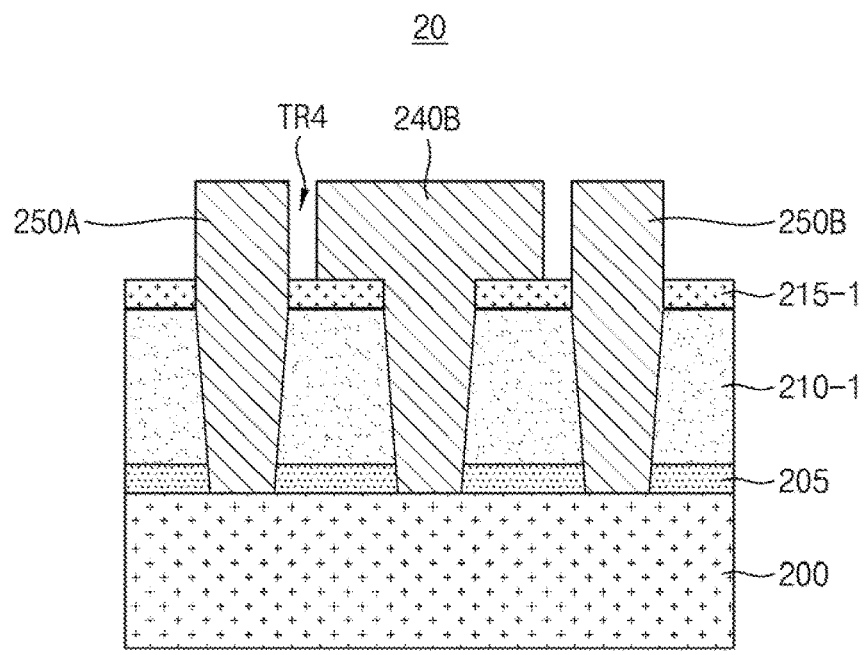
Figure 2L:
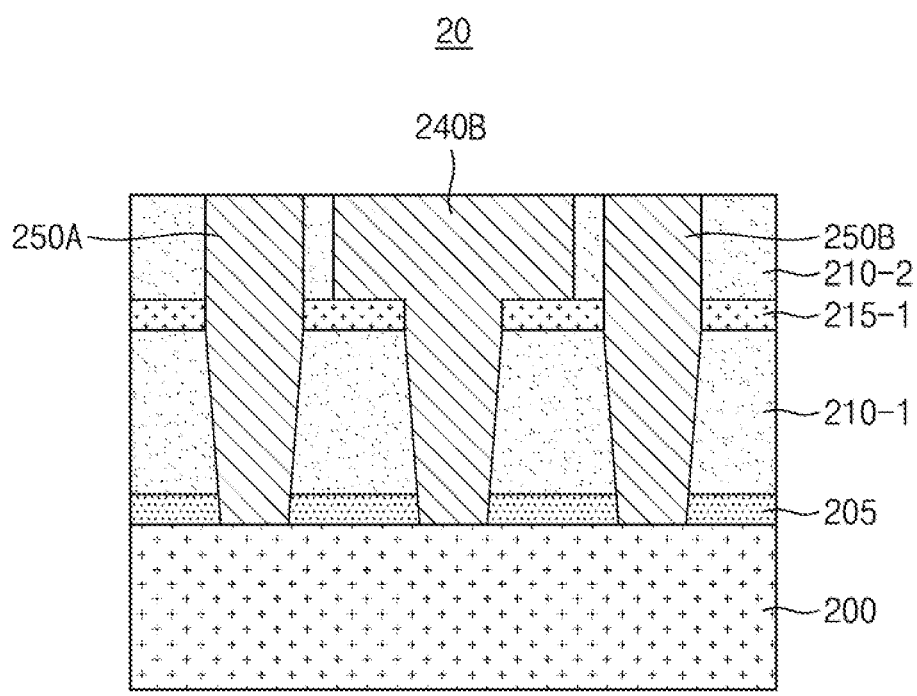

In the meantime, FIG. 2J illustrates a cross-section view of the above-described semi-damascene structure along a line II-II' shown in FIG. 2G, and FIGS. 2K and 2L illustrate manufacturing operations subsequent to the manufacturing operation shown in FIG. 2J, according to embodiments.

Referring to FIGS. 2J and 2K, when metal lines 250A and 250B are patterned by direct etching (not shown) using the 2$^{nd}$ hardmask layer 215-2 to obtain narrow 4$^{th}$ trenches TR4, no etch loading occurs on the 1$^{st}$ intermetal dielectric layer 210-1 due to the 1$^{st}$ hardmask layer 215-1. Further, since the 2$^{nd}$ hardmask layer 215-2 has material composition with an etch rate or etch selectivity which is different from that of material composition of the 1$^{st}$ hardmask layer 215-1 according to the present embodiment, the 1$^{st}$ hardmask layer 215-1 remains on the 1$^{st}$ intermetal dielectric layer 210-1 when wet etching is applied to the semiconductor device structure to remove the 2$^{nd}$ hardmask layer 215-2.

Subsequently, the 2$^{nd}$ intermetal dielectric layer 210-2 is formed to isolate the metal line 240B from metal lines 250A and 250B that vertically penetrate the 1$^{st}$ intermetal dielectric layer 210-1 and the 2$^{nd}$ intermetal dielectric layer 210-2, thereby to complete the semi-damascene structure, as shown in FIG. 2L. It is noted here that, in the completed semi-damascene structure shown in FIG. 2L, the 1$^{st}$ hardmask layer 215-1 is interposed between the 1$^{st}$ intermetal dielectric layer 210-1 and the 2$^{nd}$ intermetal dielectric layer 210-2.

According to an embodiment, the 2$^{nd}$ hardmask layer 215-2 may have material composition with an etch rate or etch selectivity which is the same or substantially the same as that of material composition of the 1$^{st}$ hardmask layer 215-1, as described below.

Figure 3A:
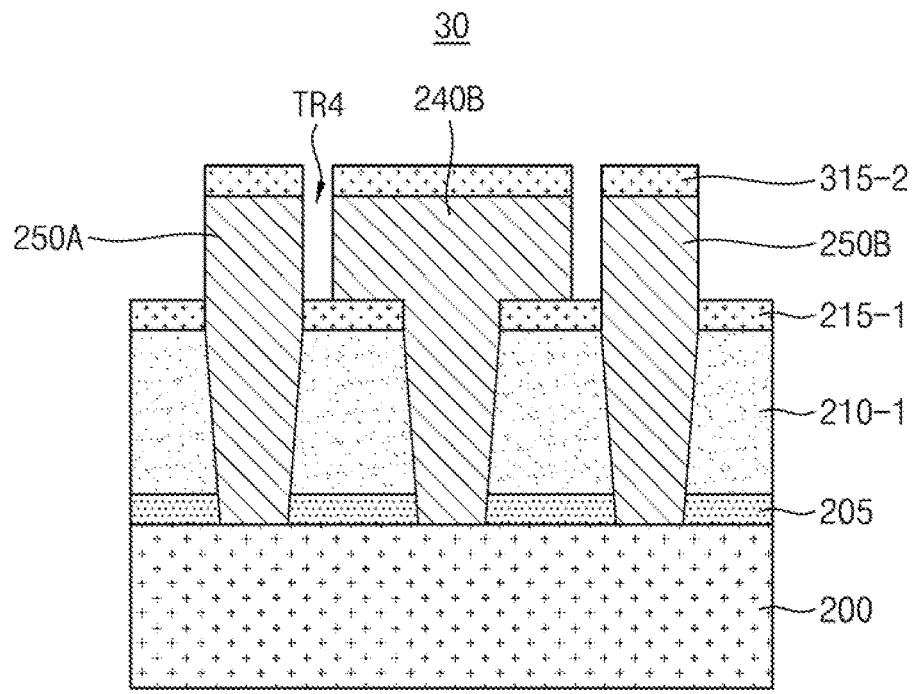
FIGS. 3A-3C illustrate a method of manufacturing a semi-damascene structure of a semiconductor device, according to another embodiment.
Figure 3B:
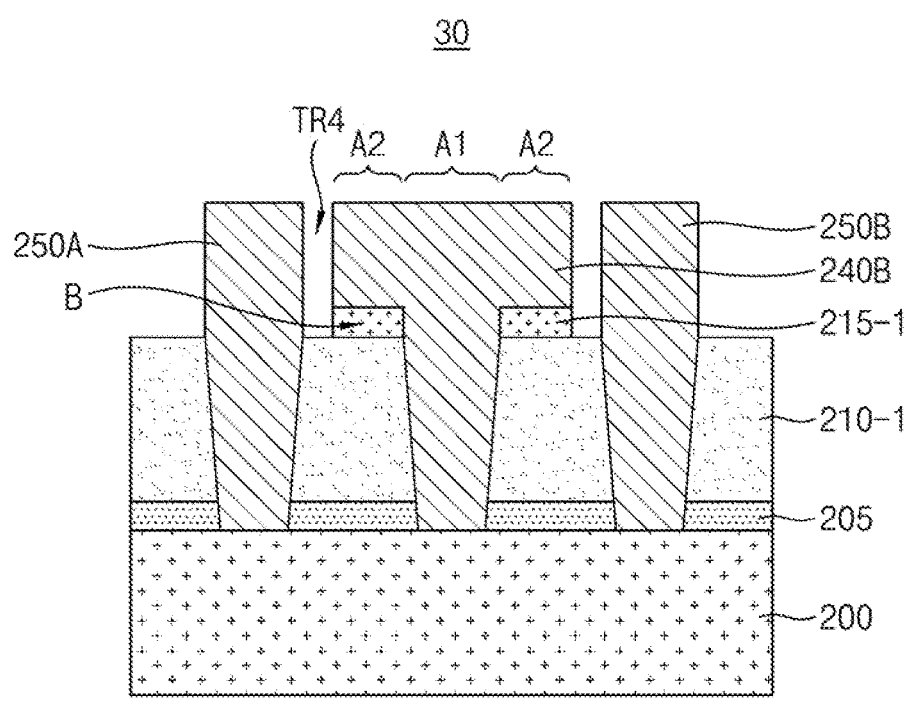
Figure 3C:
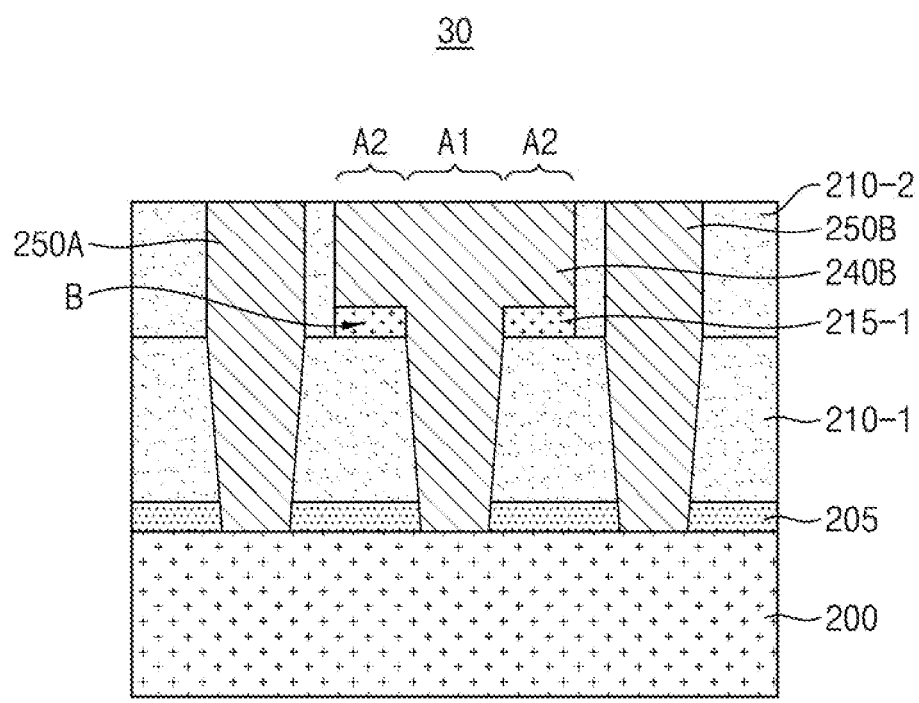

FIGS. 3A-3C illustrate a method of manufacturing a semi-damascene structure of a semiconductor device, according to another embodiment. It is noted that manufacturing operations described in reference to FIGS. 3A-3C correspond to those described in reference to FIGS. 2J-2L, respectively.

Referring to FIGS. 3A-3C, various elements of a semi-damascene structure of a semiconductor device structure 30 shown therein are the same as those shown in FIGS. 2J-2L, except that a 2$^{nd}$ hardmask layer 315-2 has material composition with an etch rate or etch selectivity which is the same or substantially the same as that of material composition of the 1$^{st}$ hardmask layer 215-1, according to an embodiment.

Thus, as shown in FIG. 3B, when the 2$^{nd}$ hardmask layer 315-2 is removed by wet etching, the 1$^{st}$ hardmask layer 215-1 exposed upward though the 4$^{th}$ trench TR4 is also removed, leaving only a portion B of the 1$^{st}$ hardmask layer 215-1 formed below the portion A2 of the metal line 240B above the 1$^{st}$ intermetal dielectric layer 210-1. Thus, the semi-damascene structure 30 shown in FIG. 3C is different from the semi-damascene structure 20 shown in FIG. 2L by the 1$^{st}$ hardmask layer 215-1.

Referring to FIG. 3C, the 4$^{th}$ trench TR4 is filled out by the 2$^{nd}$ intermetal dielectric layer 210-2 to isolate the metal lines 240B, 250A and 250B from one another, thereby completing the semi-damascene structure. It is noted here that, in the completed semi-damascene structure shown in FIG. 3C, the 1$^{st}$ intermetal dielectric layer 210-1 and the 2$^{nd}$ intermetal dielectric layer 210-2 are connected to each other without the 1$^{st}$ hardmask layer 215-1 therebetween, unlike the semi-damascene structure shown in FIG. 2L in which the hardmask layer 215-1 is interposed between the 1$^{st}$ intermetal dielectric layer 210-1 and the 2$^{nd}$ intermetal dielectric layer 210-2 in the semi-damascene structure 20.

In practical application of the above-method of manufacturing a semi-damascene structure, a resulting semi-damascene structure may be formed slightly differently from the semi-damascene structure shown in FIGS. 2J-2L and FIGS. 3A-3C.

Figure 4A:
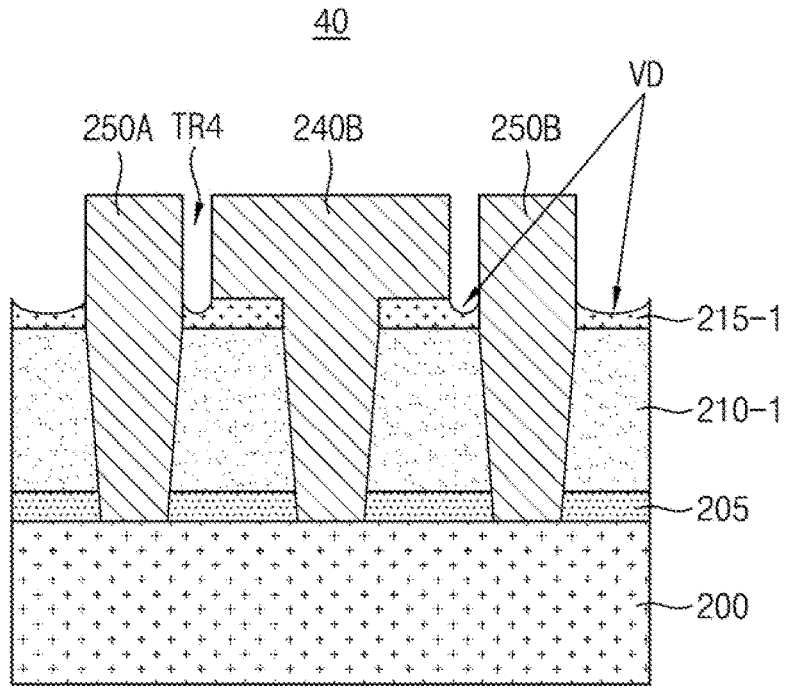
FIGS. 4A-4B illustrate a method of manufacturing a semi-damascene structure of a semiconductor device, according to still another embodiment.
Figure 4B:
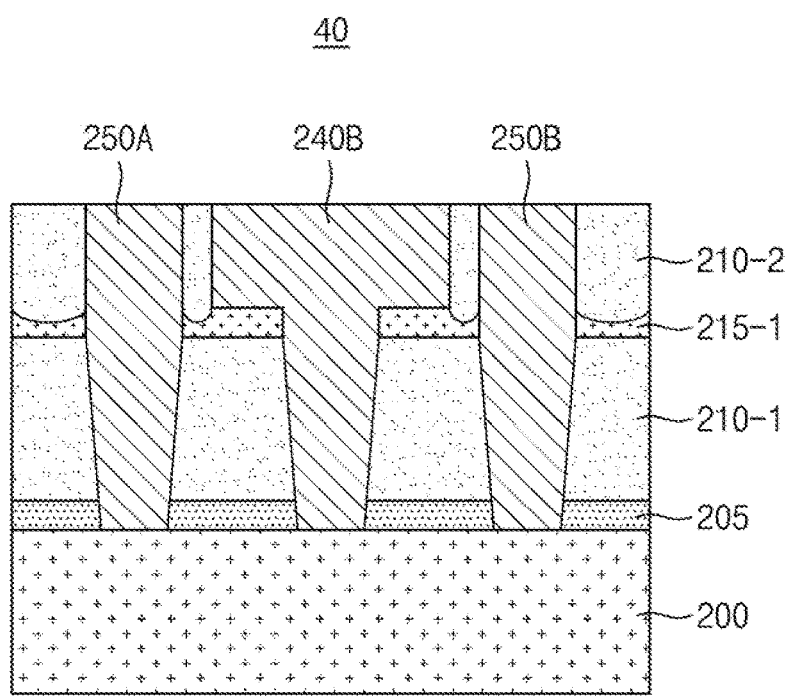

FIGS. 4A-4B illustrate a method of manufacturing a semi-damascene structure of a semiconductor device, according to still another embodiment. It is noted that manufacturing operations described in reference to FIGS. 4A-4B correspond to those described in reference to FIGS. 2K-2L, respectively.

Referring to FIGS. 4A-4B, various elements of a semi-damascene structure of a semiconductor device structure 40 shown therein are the same as those shown in FIG. 2K-2L. In the present embodiment, however, as shown in FIGS. 4A-4B, when the semi-damascene structure shown in FIG. 2J is wet-etched to remove the 2$^{nd}$ hardmask layer 215-2, an upper portion of the 1$^{st}$ hardmask layer 215-1 may be etched to take a form of a vertical dent VD even if the 1$^{st}$ hardmask layer 215-1 may have material composition different from the 2$^{nd}$ hardmask layer 215-2 in terms of etch rate or etch selectivity.

Figure 5A:
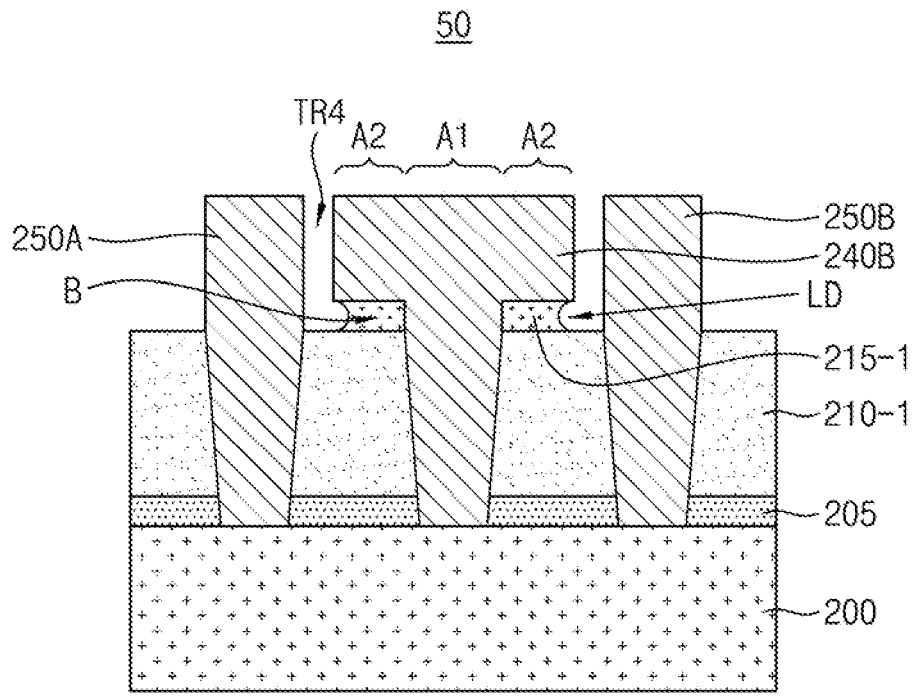
FIGS. 5A-5C illustrate a method of manufacturing a semi-damascene structure of a semiconductor device, according to yet another embodiment.
Figure 5B:
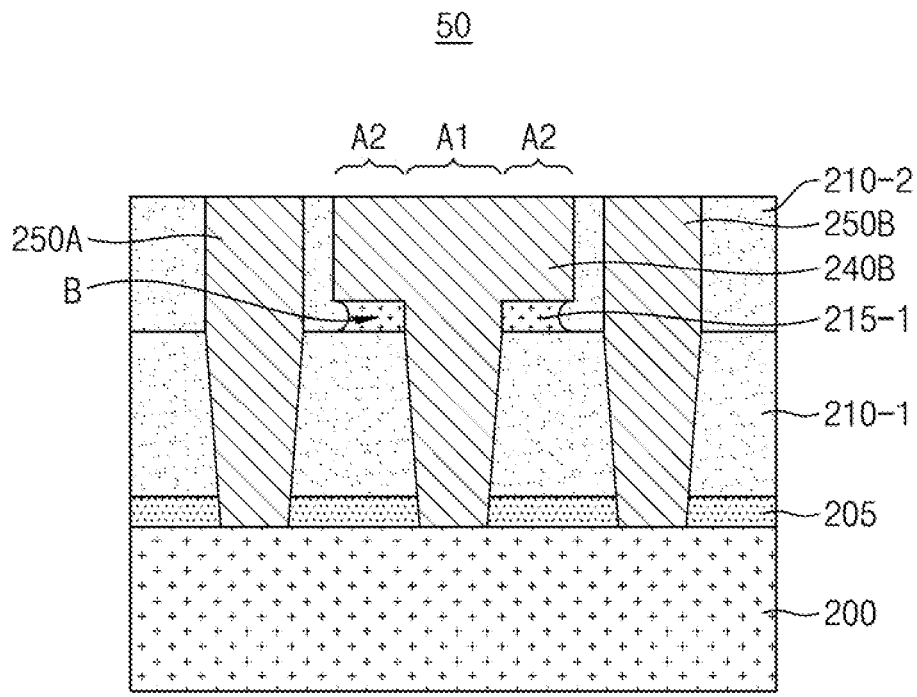

FIGS. 5A-5B illustrate a method of manufacturing a semi-damascene structure of a semiconductor device, according to yet another embodiment. It is noted that manufacturing operations described in reference to FIGS. 5A-5B correspond to those described in reference to FIGS. 3B-3C, respectively.

Referring to FIGS. 5A-5B, various elements of a semi-damascene structure of a semiconductor device structure 50 shown therein are the same as those shown in FIG. 3B-3C. In the present embodiment, however, as shown in FIGS. 5A-5B, when the semi-damascene structure shown in FIG. 3A is wet-etched to remove the 2$^{nd}$ hardmask layer 315-2 and the 1$^{st}$ hardmask layer 215-1 exposed through the 4$^{th}$ trench TR4, the portion B of the 1$^{st}$ hardmask layer 215-1 formed below the portion A2 of the metal line 240B above the 1$^{st}$ intermetal dielectric layer 210-1 and exposed toward the 4$^{th}$ trench TR4 may be laterally etched to take a form of a lateral dent LD.

Figure 5C:
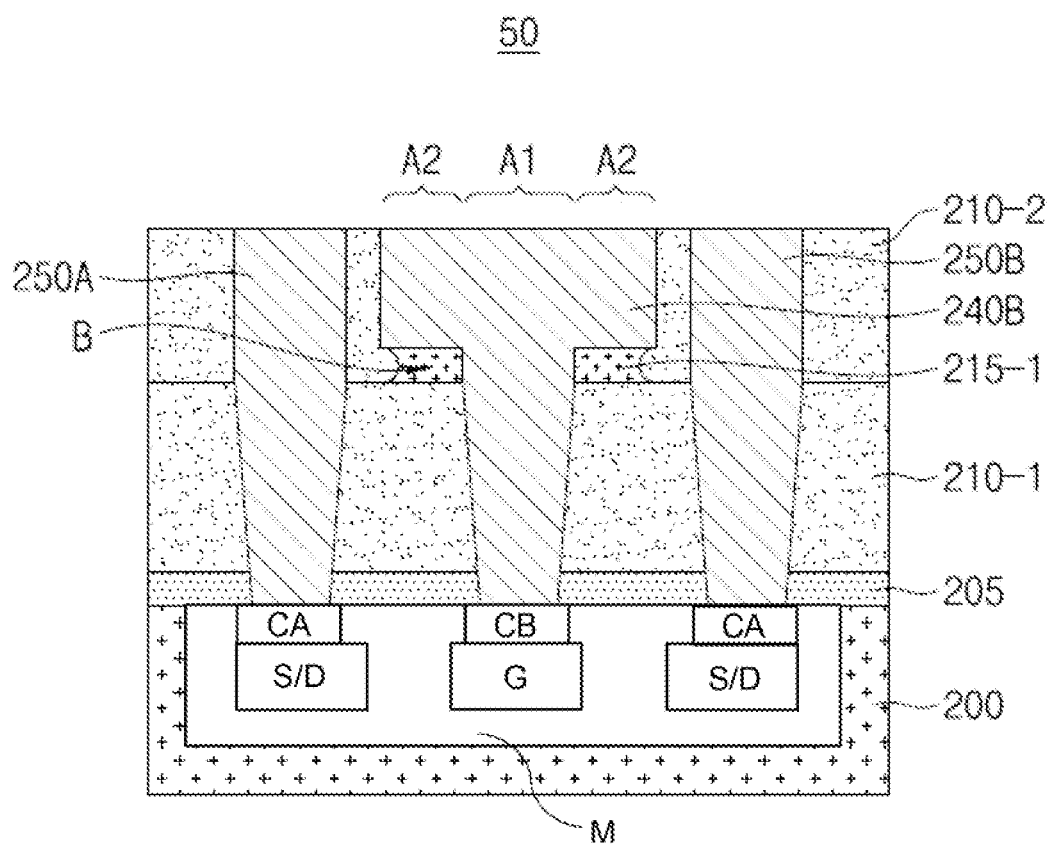

FIG. 5C illustrates a semiconductor device structure in which a semi-damascene structure is formed above a substrate including a memory cell, according to an embodiment.

Referring to FIG. 5C, the semi-damascene structure shown in FIGS. 5A and 5B is connected to active regions of at least one transistor of a memory cell M included in the substrate 200 to form the semiconductor device structure 50. Although the substrate 200 is seen to include only one memory cell M, there may be a plurality a plurality of memory cells including the memory cell M. FIG. 5C shows that the metal lines 240B, 250A and 250B isolated from one another by the 1$^{st}$ and 2$^{nd}$ intermetal dielectric layers 210-1 and 210-2 are connected to a gate structure G and source/drain regions S/D through a gate contact plug CB and source/drain contact plugs CA, respectively, to connect the memory cell M with a power source or another circuit element (not shown).

It is noted that as the above semi-damascene structure includes the 1$^{st}$ and 2$^{nd}$ intermetal dielectric layers 210-1 and 210-2 formed without over-etching or under-etching addressed in FIGS. 1A-1F, the entire performance of the semiconductor device structure 50 including the memory cell M may be improved.

It is further understood that the memory cell M shown in FIG. 5C may also be implemented in the semiconductor device structures 20, 30 and 40 shown in FIGS. 2L, 3C and 4B to be connected to the respective semi-damascene structures.

Figure 6A:
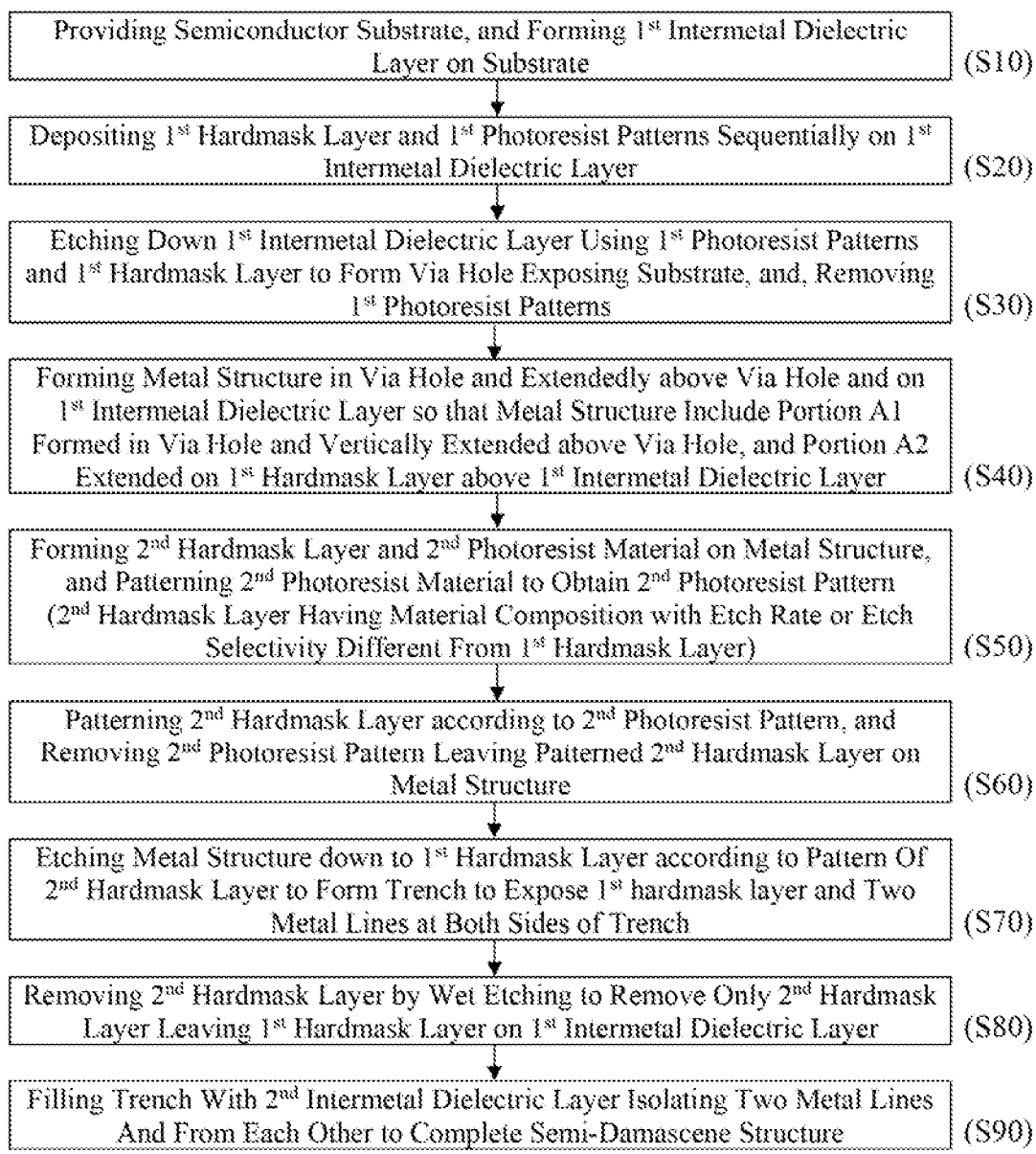
FIG. 6A illustrates a flowchart describing a method of forming a semi-damascene structure of a semiconductor device, according to an embodiment.

FIG. 6A illustrates a flowchart describing a method of forming a semi-damascene structure of a semiconductor device, according to an embodiment.

In operation S10, a semiconductor substrate is provided, and a $1^{st}$ intermetal dielectric layer is formed on the substrate. See FIG. 2A. An etch stop layer may be interposed between the substrate and the $1^{st}$ intermetal dielectric layer, according to an embodiment. The substrate may include an active device such as a transistor and a passive device such as a capacitor, and at least one active region of the transistor may be directly or indirectly connected to a metal line to be formed in the semi-damascene structure. The $1^{st}$ intermetal dielectric layer may be formed by at least one of PECVD and flowable CVD, not being limited thereto.

In operation S20, a $1^{st}$ hardmask layer and a plurality of $1^{st}$ photoresist patterns are sequentially deposited on the $1^{st}$ intermetal dielectric layer by at least one of PVD, CV, PECVD and ALD, not being limited thereto. See FIG. 2B. While the $1^{st}$ photoresist patterns may be formed of an organic polymer resin containing a photoactive (light sensitive) material, the $1^{st}$ hardmask layer may be formed of at least one of $AlO_x$, AlN, AlON, $SiO_2$, SiON and SiCN, not being limited thereto.

In operation S30, the $1^{st}$ intermetal dielectric layer is etched down using the $1^{st}$ photoresist patterns and the $1^{st}$ hardmask layer as mask structures to form at least one via hole exposing the substrate, and then, the $1^{st}$ photoresist patterns are removed by stripping, ashing and/or etching operations. See FIG. 2C. In this operation, when the $1^{st}$ intermetal dielectric layer is etched and the $1^{st}$ photoresist patterns are removed, the $1^{st}$ hardmask layer is not removed along with the $1^{st}$ photoresist patterns. Instead, the $1^{st}$ hardmask layer remains on the $1^{st}$ intermetal dielectric layer, according to an embodiment. Here, although the $1^{st}$ hardmask layer may be formed of a plurality of vertically stacked layers, substantially all of the layers of the $1^{st}$ hardmask layer may remain on the $1^{st}$ intermetal dielectric layer without being removed along with the photoresist pattern for process convenience, according to an embodiment.

It is noted that the $1^{st}$ hardmask layer is left on the $1^{st}$ intermetal dielectric layer without being removed in order to avoid a possible damage to the $1^{st}$ intermetal dielectric layer that may occur when a metal structure is filled in the via hole and extends on the $1^{st}$ intermetal dielectric layer in a subsequent operation (S40), and further, prevent etch loading due to over-etching or under-etching of the metal structure in a later operation (S70).

In operation S40, the metal structure is filled in the via hole and extendedly formed above the via hole and on the $1^{st}$ intermetal dielectric layer, by which the metal structure may include at least one portion A1 formed in the via hole and vertically extended above the via hole, and at least one portion A2 extended on the $1^{st}$ hardmask layer above the $1^{st}$ intermetal dielectric layer. See FIG. 2D. According to an embodiment, the metal structure may be formed of a material such as Ru, Mo, Co and W, or their combination, not being limited thereto, which is suitable for direct etching thereon. As the metal structure is formed on the intermetal dielectric layer with the $1^{st}$ hardmask layer interposed therebetween, the metal structure does not directly contact the intermetal dielectric layer, and thus, a possible damage to the intermetal dielectric layer can be avoided.

In operation S50, a $2^{nd}$ hardmask layer and a $2^{nd}$ photoresist material are sequentially formed on the metal structure, and the $2^{nd}$ photoresist material is patterned to obtain at least one $2^{nd}$ photoresist pattern in the same process applied to the formation of the $1^{st}$ photoresist patterns and the $1^{st}$ hardmask layer. See FIG. 2E. Here, the $2^{nd}$ photoresist material is formed of the same material forming the $1^{st}$ photoresist patterns, and the $2^{nd}$ hardmask layer may have material composition with an etch rate or etch selectivity which is different from material composition of the $1^{st}$ hardmask layer, according to an embodiment.

In operation S60, the $2^{nd}$ hardmask layer is patterned according to the $2^{nd}$ photoresist pattern, which is removed thereafter by stripping, ashing and/or etching that leaves the patterned $2^{nd}$ hardmask layer on the metal structure. See FIG. 2F.

In operation S70, the metal structure is etched down to the $1^{st}$ hardmask layer according to the pattern of the $2^{nd}$ hardmask layer. See FIGS. 2G and 2J. The etching operation applied here may be, for example, direct etching, which may be plasma dry etching, not being limited thereto. As a result of the direct etching on the metal structure, a trench is formed to expose the $1^{st}$ hardmask layer, and two metal lines are formed from the metal structure at both sides of the trench. Due to this $1^{st}$ hardmask layer, the $1^{st}$ intermetal dielectric layer may not be adversely affected by over-etching or the metal structure may not be short-circuited by under-etching.

In operation S80, the patterned $2^{nd}$ hardmask layer is removed, for example, by wet etching. In the present embodiment, the $2^{nd}$ hardmask layer may have material composition with etch rate or etch selectivity different from that of the $1^{st}$ hardmask layer. Thus, the wet etching applied in this operation may remove only the $2^{nd}$ hardmask layer leaving the $1^{st}$ hardmask layer on the $1^{st}$ intermetal dielectric layer as shown in FIGS. 2H and 2K. However, according to an embodiment, when the $2^{nd}$ hardmask layer is removed by the wet etching, at least an upper portion of the $1^{st}$ hardmask layer may also be removed to form a vertically dent on the $1^{st}$ hardmask layer. See FIG. 4A.

In operation S90, the trench formed in operation S70 is filled with a $2^{nd}$ intermetal dielectric layer isolating the two metal lines from each other to complete the semi-damascene structure. See FIGS. 2I, 2L and 4B.

Figure 6B:
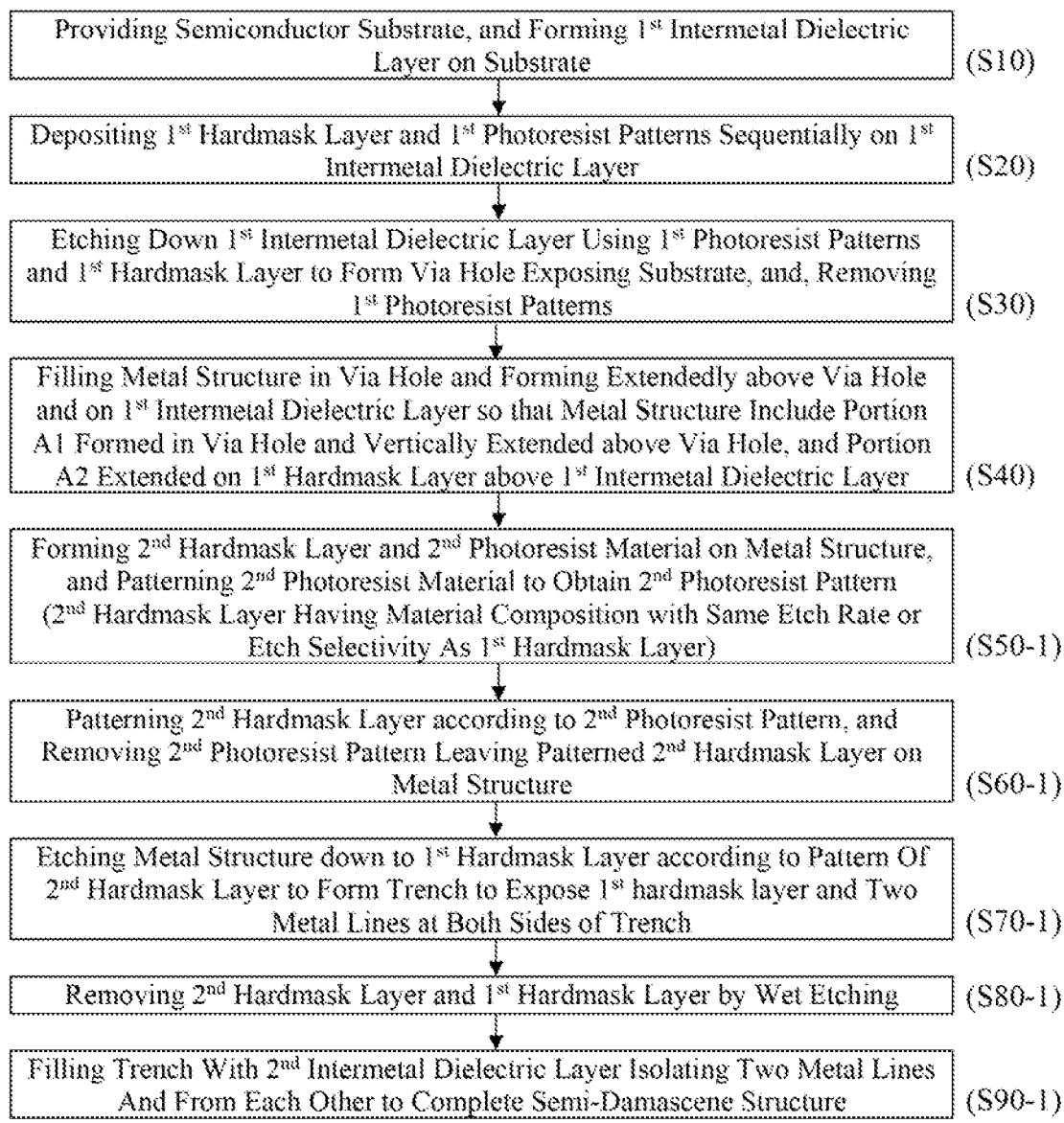
FIG. 6B illustrates a flowchart describing a method of forming a semi-damascene structure of a semiconductor device, according to another embodiment.

FIG. 6B illustrates a flowchart describing a method of forming a semi-damascene structure of a semiconductor device, according to another embodiment.

The method according to the present embodiment also includes operations S10 though S40 performed in the previous embodiment shown in FIG. 6A. Thus, descriptions above these operations are omitted herebelow. However, according to the present embodiment, the $2^{nd}$ hardmask layer may have material composition with etch rate or etch selectivity which is the same or substantially the same as material composition of the $1^{st}$ hardmask layer.

Thus, in operation S50-1, a $2^{nd}$ hardmask layer and a $2^{nd}$ photoresist material are sequentially formed on the metal structure, and the $2^{nd}$ photoresist material is patterned to obtain at least one $2^{nd}$ photoresist pattern in the same process applied to the formation of the $1^{st}$ photoresist patterns and the $1^{st}$ hardmask layer. See FIG. 2E. In this embodiment, the $2^{nd}$ photoresist material is formed of the same material forming the $1^{st}$ photoresist patterns, and the $2^{nd}$ hardmask layer has material composition with the same or substantially same etch rate or etch selectivity as that of material composition of the $1^{st}$ hardmask layer.

In operation S60-1, the $2^{nd}$ hardmask layer is patterned according to the $2^{nd}$ photoresist pattern, which is removed thereafter by stripping, ashing and/or etching that leaves the patterned $2^{nd}$ hardmask layer oven the metal structure. See FIG. 2F.

In operation S70-1, the metal structure is etched down to the $1^{st}$ hardmask layer according to the pattern of the $2^{nd}$ hardmask layer. See FIG. 2G. The etching operation applied here may be, for example, direct etching, which may be plasma dry etching, not being limited thereto. As a result of the direct etching on the metal structure, a trench is formed to expose the $1^{st}$ hardmask layer, and two metal lines are formed from the metal structure at both sides of the trench. Due to this $1^{st}$ hardmask layer, the $1^{st}$ intermetal dielectric layer may not be adversely affected by over-etching or the metal structure may not be short-circuited by under-etching.

In operation S80-1, both the patterned $2^{nd}$ hardmask layer and the $1^{st}$ hardmask layer, which is exposed through the trench, are removed, for example, by wet etching because they have material compositions with the same or substantially the same etch rate or etch selectivity. See FIG. 3B. Here, however, when the $1^{st}$ hardmask layer is removed by the wet etching, at least a side portion of the $1^{st}$ hardmask layer facing the trench formed in operation S70 may be removed to form a lateral dent on the $1^{st}$ hardmask layer. See FIG. 5A In operation S90-1, the trench formed in operation S70 is filled with a $2^{nd}$ intermetal dielectric layer isolating the two metal lines 240A and 240B from each other to complete the semi-damascene structure. See FIGS. 3C and 5B Thus far, each of the semi-damascene structures formed according to the above embodiments as shown in FIGS. 2A-2L through FIGS. 6A-6B, respectively, is described as being directly or indirectly connected to an active region of a transistor formed below the semi-damascene structure. Thus, each of these semi-damascene structures may be an element or component of a BEOL structure formed on a front-end-of-line (FEOL) structure or a middle-of-line (MOL) structure of a semiconductor device, according to embodiments. However, each of these semi-damascene structure may also be formed as an element of an FEOL or MOL structure, or may be formed on another BEOL structure including another semi-damascene structure to be connected thereto, according to embodiments.

Figure 7:
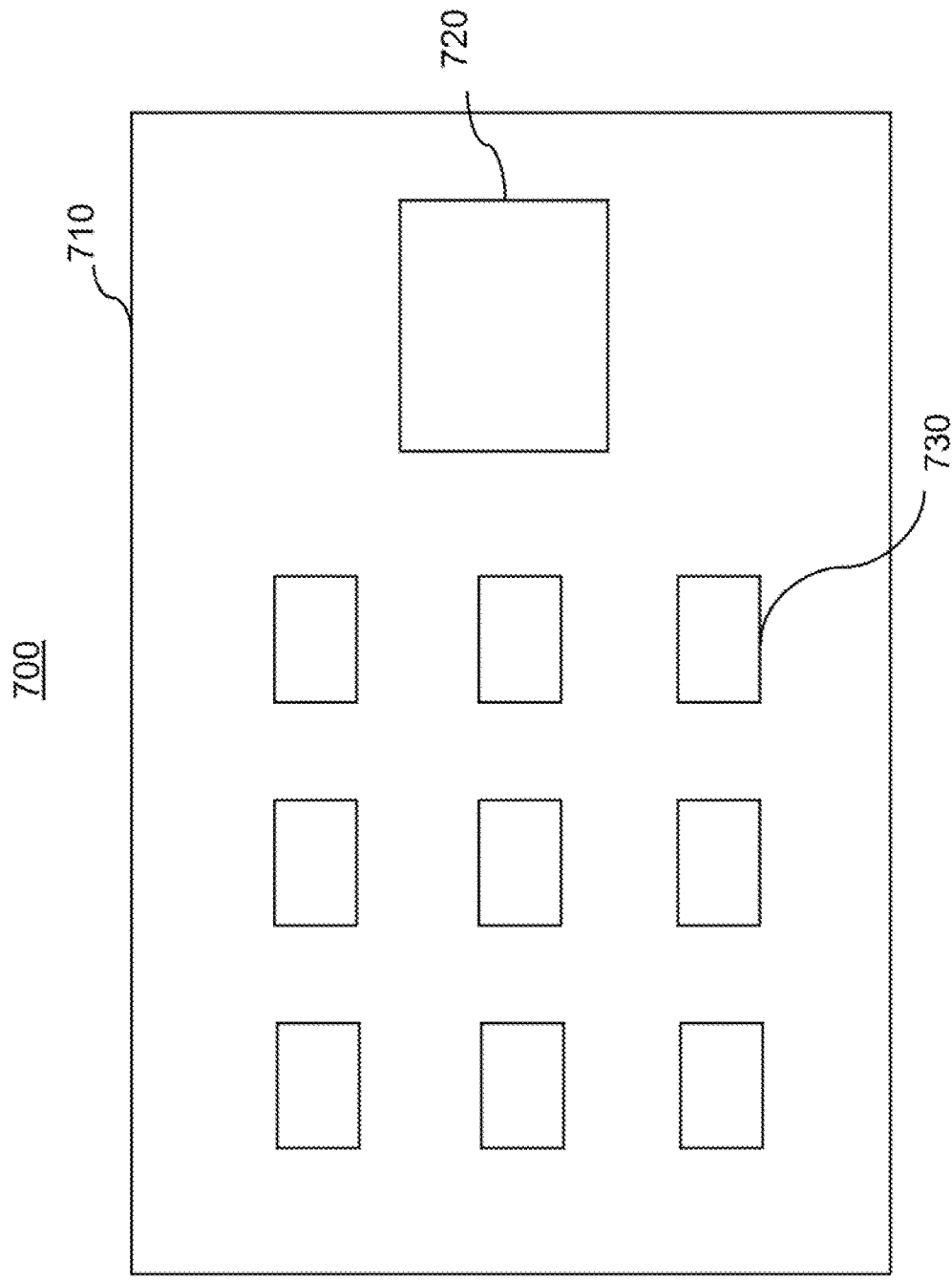
FIG. 7 illustrates a schematic plan view of a semiconductor module according to an embodiment.

FIG. 7 illustrates a schematic plan view of a semiconductor module according to an embodiment.

Referring to FIG. 7, a semiconductor module 700 according to an embodiment may include a processor 720 and semiconductor devices 730 that are mounted on a module substrate 710. The processor 720 and/or the semiconductor devices 730 may include one or more semi-damascene structures described in the above embodiments.

Figure 8:
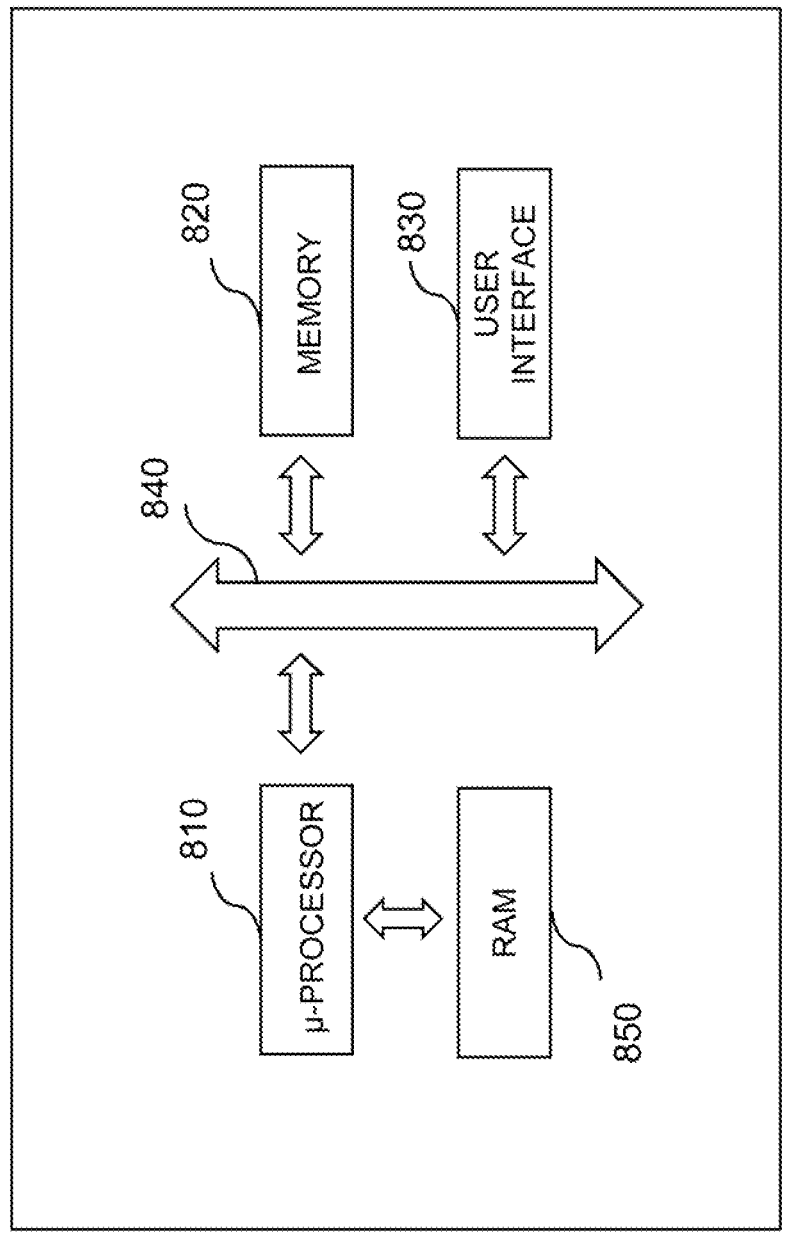
FIG. 8 illustrates a schematic plan view of a semiconductor module according to an embodiment.

FIG. 8 illustrates a schematic block diagram of an electronic system according to an embodiment.

Referring to FIG. 8, an electronic system 800 in accordance with an embodiment may include a microprocessor 810, a memory 820, and a user interface 830 that perform data communication using a bus 840. The microprocessor 810 may include a central processing unit (CPU) or an application processor (AP). The electronic system 800 may further include a random access memory (RAM) 850 in direct communication with the microprocessor 810. The microprocessor 810 and/or the RAM 850 may be implemented in a single module or package. The user interface 830 may be used to input data to the electronic system 800, or output data from the electronic system 800. For example, the user interface 830 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 820 may store operational codes of the microprocessor 810, data processed by the microprocessor 810, or data received from an external device. The memory 820 may include a memory controller, a hard disk, or a solid state drive (SSD).

At least the microprocessor 810, the memory 820 and/or the RANI 850 in the electronic system 800 may include one or more semi-damascene structure described in the above embodiments.

The foregoing is illustrative of exemplary embodiments and is not to be construed as limiting thereof. For example, one or more steps described above for manufacturing a supervia may be omitted to simplify the process. Although a few exemplary embodiments have been described, those skilled in the art will readily appreciate that many modifications are possible in the above embodiments without materially departing from the inventive concept.

What is claimed is:

1. A method of manufacturing a semi-damascene structure of a semiconductor device, the method comprising:
   forming a $1^{st}$ intermetal dielectric layer;
   forming a $1^{st}$ hardmask layer and at least one $1^{st}$ photoresist pattern on the $1^{st}$ intermetal dielectric layer;
   patterning at least one via hole penetrating through the $1^{st}$ hardmask layer and the $1^{st}$ intermetal dielectric using the at least one $1^{st}$ photoresist pattern;
   removing the at least one $1^{st}$ photoresist pattern;
   forming a metal structure in the at least one via hole such that the metal structure fills in the at least one via hole and extends on the $1^{st}$ hardmask layer;
   patterning the metal structure to form at least one $1^{st}$ trench penetrating at least the metal structure at a portion where the metal structure extends on the $1^{st}$ hardmask layer; and
   filling the at least one $1^{st}$ trench with a $2^{nd}$ intermetal dielectric layer.

2. The method of claim 1, wherein the patterning the metal structure comprises:
   forming a $2^{nd}$ hardmask layer on the metal structure, and patterning the $2^{nd}$ hardmask layer; and
   wherein the patterning the metal structure comprises performing direct etching on the metal structure according to the patterned $2^{nd}$ hardmask layer, after which the $2^{nd}$ hardmask layer is removed.

3. The method of claim 2, wherein the $2^{nd}$ hardmask layer has material composition with an etch rate or etch selectivity which is different from that of material composition of the $1^{st}$ hardmask layer.

4. The method of claim 3, wherein after the metal structure is patterned and the $2^{nd}$ hardmask layer is removed, at least a portion of the $1^{st}$ hardmask layer is exposed upward through the at least one $1^{st}$ trench and remains on the $1^{st}$ intermetal dielectric layer.

5. The method of claim 4, further comprising:
   forming at least one $2^{nd}$ photoresist pattern having at least one $2^{nd}$ trench on the $2^{nd}$ hardmask layer,
   wherein the patterning the metal structure comprising performing direct etching on the metal structure according to the patterned $2^{nd}$ hardmask layer after which the $2^{nd}$ hardmask layer is removed is performed according to the $2^{nd}$ photoresist pattern, after which the $2^{nd}$ photoresist pattern is removed.

6. The method of claim 3, wherein after the metal structure is patterned and the $2^{nd}$ hardmask layer is removed, the $1^{st}$ hardmask layer is exposed upward through the at least one $1^{st}$ trench and remains on the $1^{st}$ intermetal dielectric layer with an upper portion of the $1^{st}$ hardmask layer exposed upward through the at least one $1^{st}$ trench being vertically dented.

7. The method of claim 3, wherein the $2^{nd}$ hardmask layer has material composition with an etch rate or etch selectivity which is the same as or substantially the same as that of material composition of the $1^{st}$ hardmask layer.

8. The method of claim 7, wherein after the patterning the metal structure, the $2^{nd}$ hardmask layer and the $1^{st}$ hardmask layer, which is exposed upward through the at least one $1^{st}$ trench, are removed.

9. The method of claim 8, further comprising:
forming at least one $2^{nd}$ photoresist pattern having at least one $2^{nd}$ trench on the $2^{nd}$ hardmask layer,
wherein the patterning the $2^{nd}$ hardmask layer and the metal structure by direct etching is performed according to the $2^{nd}$ photoresist pattern, after which the $2^{nd}$ photoresist pattern is removed.

10. The method of claim 7, wherein after the patterning the metal structure, the $2^{nd}$ hardmask layer and the $1^{st}$ hardmask layer, which is exposed upward through the at least one $1^{st}$ trench, are removed, and a portion of the $1^{st}$ hardmask layer formed below the metal structure above the $1^{st}$ intermetal dielectric layer and exposed toward the at least one $1^{st}$ trench are laterally dented.

11. A method of manufacturing a semiconductor device, the method comprising:
forming a substrate in which at least one transistor structure is included;
and performing the method of claim 3 to obtain a semi-damascene structure such that the metal structure is connected to an active region of the at least one transistor structure.

\* \* \* \* \*